(12) United States Patent
Tondra et al.

(10) Patent No.: US 7,609,054 B2
(45) Date of Patent: Oct. 27, 2009

(54) MAGNETIC PARTICLE FLOW DETECTOR

(75) Inventors: Mark C. Tondra, Minneapolis, MN (US); John M. Anderson, Villa Rica, GA (US); David J. Brownell, Eden Prairie, MN (US); Anthony D. Popple, Eden Prairie, MN (US)

(73) Assignee: NVE Corporation, Eden Prairie, MN (US)

( * ) Notice: Subject to any disclaimer, the term of this patent is extended or adjusted under 35 U.S.C. 154(b) by 0 days.

(21) Appl. No.: 12/152,183

(22) Filed: May 13, 2008

(65) Prior Publication Data

US 2008/0218157 A1  Sep. 11, 2008

Related U.S. Application Data

(62) Division of application No. 11/241,771, filed on Sep. 29, 2005, now Pat. No. 7,391,091.

(60) Provisional application No. 60/614,279, filed on Sep. 29, 2004.

(51) Int. Cl.
*G01N 27/74* (2006.01)
*G01R 33/12* (2006.01)

(52) U.S. Cl. .................................... 324/204
(58) Field of Classification Search .............. 324/204
See application file for complete search history.

(56) References Cited

U.S. PATENT DOCUMENTS

| | | | |
|---|---|---|---|
| 5,186,827 A | 2/1993 | Liberti et al. |
| 5,466,574 A | 11/1995 | Liberti et al. |
| 5,498,298 A | 3/1996 | Wecker et al. |
| 5,569,544 A | 10/1996 | Daughton |
| 5,656,429 A | 8/1997 | Adelman |
| 5,660,990 A | 8/1997 | Rao et al. |
| 5,668,473 A | 9/1997 | Van Den Berg |
| 5,686,838 A | 11/1997 | Van Den Berg |
| 5,691,936 A | 11/1997 | Sakakima et al. |
| 5,750,270 A | 5/1998 | Tang et al. |
| 5,831,426 A | 11/1998 | Black, Jr. et al. |

(Continued)

FOREIGN PATENT DOCUMENTS

EP  0 165 633 B1  10/1993

(Continued)

OTHER PUBLICATIONS

Pekas, N. et al. "Magnetic Particle Diverter in an Integrated Microfluidic Format", Journal of Magnetism and Magnetic Materials, 293 (2005) 584-588.

(Continued)

*Primary Examiner*—Evan Pert
(74) *Attorney, Agent, or Firm*—Kinney & Lange, P.A.

(57) ABSTRACT

A ferromagnetic thin-film based magnetic field detection system having a substrate supporting a magnetic field sensor in a channel with a first electrical conductor supported on the substrate positioned at least in part along the channel gap and in direct contact with at least some surface of the magnetic field sensor ands a second electrical conductor supported on the substrate positioned at least in part along the channel gap in a region thereof adjacent to, but separated from, the magnetic field sensor.

3 Claims, 19 Drawing Sheets

U.S. PATENT DOCUMENTS

| | | | |
|---|---|---|---|
| 5,895,727 | A | 4/1999 | Hasegawa |
| 5,949,707 | A | 9/1999 | Pohm et al. |
| 5,981,297 | A | 11/1999 | Baselt |
| 5,985,153 | A | 11/1999 | Dolan et al. |
| RE36,517 | E | 1/2000 | Araki et al. |
| 6,046,585 | A | 4/2000 | Simmonds |
| 6,057,167 | A | 5/2000 | Shieh et al. |
| 6,074,743 | A | 6/2000 | Araki et al. |
| 6,083,632 | A | 7/2000 | Fujikata et al. |
| 6,090,480 | A | 7/2000 | Hayashi |
| 6,114,056 | A | 9/2000 | Inomata et al. |
| 6,124,711 | A | 9/2000 | Tanaka et al. |
| 6,462,541 | B1 | 10/2002 | Wang et al. |
| 6,736,978 | B1 | 5/2004 | Porter et al. |
| 2002/0060565 | A1 | 5/2002 | Tondra |
| 2002/0119470 | A1 | 8/2002 | Nerenberg et al. |

FOREIGN PATENT DOCUMENTS

| | | |
|---|---|---|
| JP | 63302367 A | 12/1988 |
| WO | 96/05326 | 2/1996 |
| WO | 99/18416 | 4/1999 |
| WO | 01/14591 A1 | 3/2001 |

OTHER PUBLICATIONS

Pekas, N. et al. "Giant Magnetoresistance Monitoring of Magnetic Picodroplets in an Integrated Microfluidic System", Applied Physics Letters, vol. 85, No. 20, Nov. 15, 2004, 4783-4785.

Wirix-Speetjens, R. et al. "On-Chip Magnetic Particle Transport by Alternating Magnetic Field Gradients", IEEE Transactions on Magnetics, vol. 40, No. 4, Jul. 2004, 1944-1946.

Rida, A. et al. "Long-Range Transport of Magnetic Microbeads Using Simple Planar Coils Placed in a Uniform Magnetostatic Field", Applied Physics Letters, vol. 83, No. 12, Sep. 22, 2003, 2396-2398.

Graham, D.L. et al. "Single Magnetic Microsphere Placement and Detection On-Chip Using Current Line Designs with Integrated Spin Valve Sensors: Biotechnological Applications", Journal of Applied Physics, vol. 91, No. 10, May 15, 2002, 7786-7788.

Tondra, M. et al. "Design of Integrated Microfluidic Device for Sorting Magnetic Beads in Biological Assys", IEEE Transactions on Magnetics, vol. 37, No. Nov. 6, 2001, 2621-2624.

Choi, J-W. et al. "An On-Chip Magnetic Bead Separator Using Spiral Electromagnets with Semi-Encapsulated Permalloy", Biosensors & Bioelectronics, 16 (2001), 409-416.

Tondra, M.C. et al. "Model for Detection of Immobilized Superparamagnetic Nanosphere Assay Labels Using Giant Magnetoresistive Sensors", J. Vac. Sci. Technol., A 18(4) Jul./Aug. 2000, © 2000 American Vacuum Society.

Baselt et al. "A Biosensor Based on Magnetoresistance Technology", Biosensors & Bioelectronics, 13, 731-739 (1998).

Valberg, P.A. and Butler, J.P. Magnetic particle motions within living cells: physical theory and techniques. Biophysical Journal, vol. 52, 537-550, 1987. (Abstract only).

MAGNETIC PARTICLE FLOW DETECTOR

CROSS-REFERENCE TO RELATED APPLICATIONS

This application is a divisional of application Ser. No. 11/241,771 filed on Sep. 29, 2005 now U.S. Pat. No. 7,391,091 for "MAGNETIC PARTICLE FLOW DETECTOR" which claims the benefit of Provisional Application No. 60/614,279 filed on Sep. 29, 2004 for "MAGNETIC PARTICLE FLOW DETECTOR".

BACKGROUND

The present invention relates to small magnetic material particles, or magnetizable beads, in fluid flows and, more particularly, to detection of such particles or beads in such flows.

Among the biomolecular detection methods used to detect selected molecules in the presence of other kinds of molecules mixed therewith are binding assays which are based on use of certain binding molecules to capture through specific chemical bondings the molecules selected for detection. Such specific bondings include polynucleic acid bondings or hybridizations involving DNA and RNA, antibody to antigen bondings, and various ligand to various receptor bondings. The detection of the selected molecules may be of primary interest in its own right, but may instead be of primary interest in indicating the presence of some other analyte molecule, species or organism.

An assay to measure the presence and concentration of such is begun by applying a sample solution containing various kinds of molecules, possibly including the molecules selected for detection, to the sensor along with label molecules attached to label magnetizable beads (or magnetic material particles) also present in the sample solution or in a supplemental solution concurrently also applied. The binding molecules through specific bondings, or recognition events, capture the selected molecules or the label molecules attached to label beads, or both, and thereafter hold them at the corresponding capture sites, i.e. the sites of the binding molecules undergoing such a bonding.

Label molecules on label beads are needed so that the occurrence of a recognition event leads to some measurable signal to indicate that a selected molecule was found present. One kind of label bead for doing this is a paramagnetic material bead having magnetizations that depend on externally applied magnetic fields. Application of such an externally applied field forcefully draws away any unbound label beads leaving the bound label beads at the capture sites while also magnetizing those bound label beads. Magnetic field detectors at the capture sites must sense the anomalies introduced into the externally applied field by the presence of bound label beads to produce the desired signals indicating the number of, and possibly the location of, such bound label beads. From this information the number of selected molecules, and kinds thereof, in the sample solution can be determined.

Such label beads can range in magnetic material composition from pure ferromagnetic material (e.g. permalloy) to small percentages of paramagnetic material encapsulated in plastic or ceramic spheres. As indicated above, such label beads are typically coated with a chemical or biological species that selectively binds to the selected molecules in an analyte of interest including DNA, RNA, viruses, bacteria, microorganisms, proteins, etc. to define the assay function, or the kind of recognition events, to be associated with that bead.

However, the label beads must typically be very small, that is, on the order of a few to tens of nanometers (nm) up to maybe a hundred or so or even up to a few microns in some instances. As a result the anomalies in an externally applied field will be very small. The capability for detection of such very small magnetic material particles in a microfluidic flow system has many uses. The presence and the motion of a particle in a flowing liquid relates to the velocity of the flow stream, to the transport of a particular species that may be connected to the particle, and to the results of any biochemical binding events occurring in connection with such flows, including with the species in such particle flows.

Detecting individual magnetic material particles in microfluidic flow streams is difficult in many such situations. Several magnetoresistive devices have been previously fabricated for this purpose. There has been some success with these devices, particularly in detecting relatively large (13× 18×85 μm) segments of ferrofluids in such flows. These segments filled an entire microfluidic channel in the detection device, and were directed so as to pass over some "giant magnetoresistive" effect (GMR) magnetic fields detectors formed from two ferromagnetic layers, such as permalloy material layers, being separated by a sufficiently thin conductive layer such as copper.

A significant difficulty in extending such detection technology to the detection of individual ones of the magnetic material particles in such flows is that a single particle is not necessarily confined to a specific location in the cross section of a microfluidic channel during such flow of the ferrofluids. Thus, a 1.0 μm diameter particle may stray up to 17 μm from the bottom of an 18 μm deep channel, or it may hug the bottom, the left side, or the right side of that channel. This lack of certainty in position in the flow channel leads to drastically different magnetic field disruptions or anomalies (magnetic intensity vs. time) due to those otherwise substantially identical particles passing by the magnetic field detector. These differences in field disruption characteristics result in a smaller probability of the magnetic fields detectors being able to distinguish disruption signals due to magnetic material particles passing the detector from background magnetic fluctuation noise, and so both in making quantitative calculations of particle magnetic properties and in counting each particle separately in flows of multiple magnetic material particles. Thus, there is desired a magnetic particle detector arrangement that provides for better detection of passing magnetic particles in a liquid flow entraining to an extent such particles.

SUMMARY

The present invention provides a ferromagnetic thin-film based magnetic field detection system having a substrate with a magnetic field sensor supported on at least a portion thereof at a sensor location. A channel base material is supported directly on at least a portion of the substrate but without being across the magnetic field sensor from the substrate so as to form sides of an extending opening at the sensor location that extends past the magnetic field sensor in at least two directions to thereby form an extended channel gap in the channel base material across from at least a portion of the sensor location. A first electrical conductor is supported on the substrate positioned at least in part along the channel gap and in direct contact with at least some surface of the magnetic field sensor. A second electrical conductor is supported on the substrate positioned at least in part along the channel gap in a region thereof adjacent to, but separated from, the magnetic field sensor.

DETAILED DESCRIPTION

Figure 1:
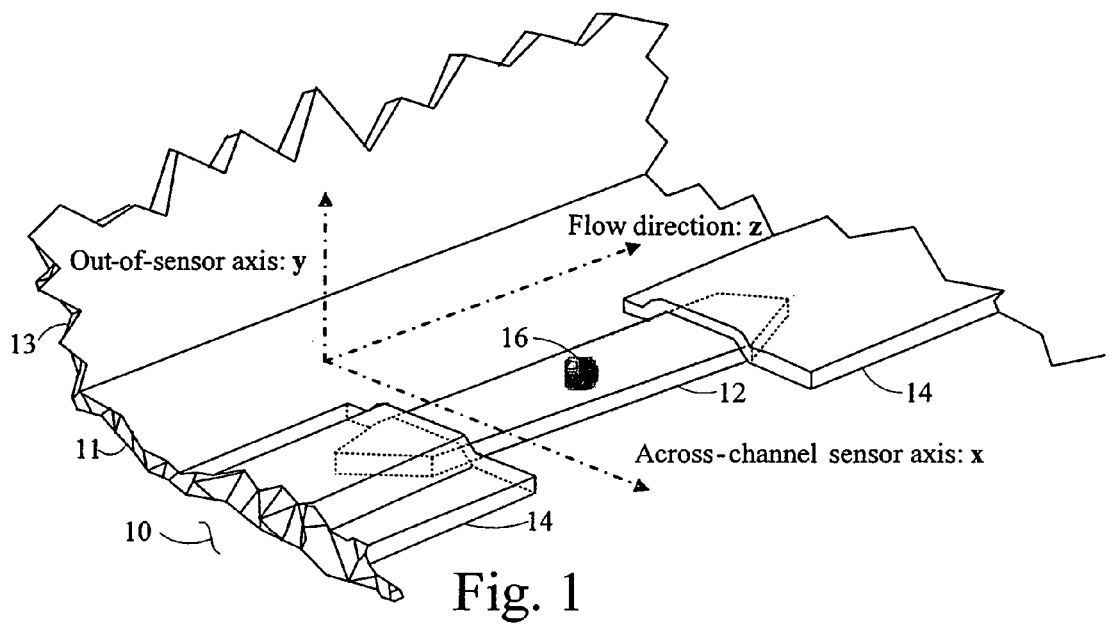
FIG. 1 shows a fragmentary perspective view of a structure embodying the present invention for detecting particles in a flow.

Detection of individual magnetic material particles in a liquid flow entraining them to some extent is not so difficult for many larger size magnetic material particles (Dynal 2.8 mm diameter particles, for instance) because the intrinsic signal to noise ratio is very large. As such particles get smaller, however, the detection problem becomes more difficult.

Confining small magnetic material particles entrained to an extent in a liquid flow to specific parts of the cross section of the flow channel so as to pass a particle detector, however, greatly enhances the detectability of single ones of multiple particles in such flows. Furthermore, confining particles to that part of the cross section of the flow channel that is nearest to the magnetic field detector increases the magnitude at that detector of the magnetic field disruptions that result from the passage thereby of single ones of the multiple particles in the flow.

Controlling both the flow speed and the location of particles in the channel cross sectional planes, at least in the vicinity of the detector, is needed so that the magnetic field disruption due to a passing particle is predictable. Combining a magnetic field sensing based magnetic material particle flow detector with a magnetic material particle path director results in the particle path director applying magnetic field based forces to passing magnetic material particles in a liquid flow such that those particles are confined to a small fraction of the total cross section of the operating flow channel near the magnetic field disruption detector. Thus, this magnetic field disruption detector is situated near the flow channel, and on that side or bottom of the channel to which the particle director is confining the particles entrained in those flows.

In a dilute aqueous suspension, the magnetic force Fmag acting on a superparamagnetic particle in a magnetic field of free-air inductance B in free air is given in SI units as $$F_{mag} = \frac{V\chi}{\mu_0}(B \cdot \nabla)B,$$

where V is the particle volume, $\chi$ is the magnetic susceptibility of the particle, and $\mu_0$ is the magnetic permeability value in a vacuum. Since the current density J within the microchannel equals zero, Ampère's law ($\nabla \times B = \mu_0 J$) indicates that the curl of vector B vanishes within the volume element defined by the microfluidic channel. We can therefore use the vector identity $\nabla(B \cdot B) = 2B \times (\nabla \times B) + 2(B \cdot \nabla)B$ to transform the previous force equation into $$F_{mag} = \frac{V\chi}{2\mu_0}\nabla B^2.$$

The magnetic force acting on the particle can now be calculated using this last equation. Because of the flow channel geometry (long and narrow), and because of the use of current straps entrenched along the bottom of the channel form the particle director, the analysis can be reduced to being based on two dimensions rather than on three dimensions. Thus, the magnetic field present at any point in the area of a cross section of the channel can be calculated based on the external field present thereabout, including the sum of an applied field from a source thereof external to the immediate channel vicinity and the particle director current-induced field contributions as determined from the Biot-Savart law.

For the director to work effectively, the width and the position of the channel must be designed relative to the current straps in such a way that particles experience only the field above those current strap conductors extending along the channel length, conductors that are also used to interconnect to external operating circuitry the detector in that channel through being in contact with it either at the bottom or top surfaces thereof depending on the structure chosen for the current straps. That is, the direction of the magnetic field based force on particles due to the downward field gradient must be relatively uniform.

A particle trajectory in the plane of corresponding ones of channel cross section areas can be derived from the equation of motion involving viscous-drag forces in the liquid flow and channel region magnetic field based forces, or $$m\frac{dv}{dt} = -3\pi \eta a v + F_{mag}$$

where m is the mass of a particle, v is the particle velocity down through the flow stream in the plane, a is the particle diameter, and η is the dynamic viscosity of the carrier fluid which typically is 0.890 mPa at room temperature. The basic behavior of a magnetic material particle near a current carrying conductor at the bottom of a channel transporting a fluid entraining such a particle can be understood by considering the simple situation of no other magnetic fields present other than that due to such a current. The vector direction of the magnetic force is then always pointed at the conductor, and the magnitude of the force grows as the particle approaches the conductor. The lowest magnitude of force, then, is experienced by the particle at the furthest possible distance from the conductor. Solving the last equation is complicated if the changing magnetic force versus time is taken into account. But the maximum time required to draw the particle towards the conductor can be calculated by using the lowest value of the magnetic force on the particle (i.e. the force on the particle at its largest distance from the conductor). Assume that $F_{mag}$ is a constant perpendicular to the z-axis. The particle will then accelerate along the direction of the force, and the velocity dependence on time is obtained from integrating the last preceding equation to yield $$v(t) = \frac{F_{mag}}{3\pi \eta a}\left(1 - e^{-\frac{3\pi \eta a}{m}t}\right).$$

The basic result is that the magnetic material particle is attracted towards the conductor, and reaches some terminal velocity toward the conductor with a magnitude that is determined by the parameters of viscosity, particle mass, and particle diameter. Of course, the velocity towards the conductor goes to zero once the particle hits the conductor. There may be some "bouncing" although this is generally damped out by the fluid friction.

The time required for the particle to be "captured" by the conductor is calculated by integrating this last equation versus dt to find y(t). This is the maximum time for capture as the lowest possible value for the magnitude of the magnetic force generated on the particle was used. Once the particle is captured, the magnetic force continues to hold it near the conductor until other forces are applied to disrupt it. Further description of these trajectories of particles through the fluid will be provided following the description of some specific structures that take advantage of this effect.

Figure 2:
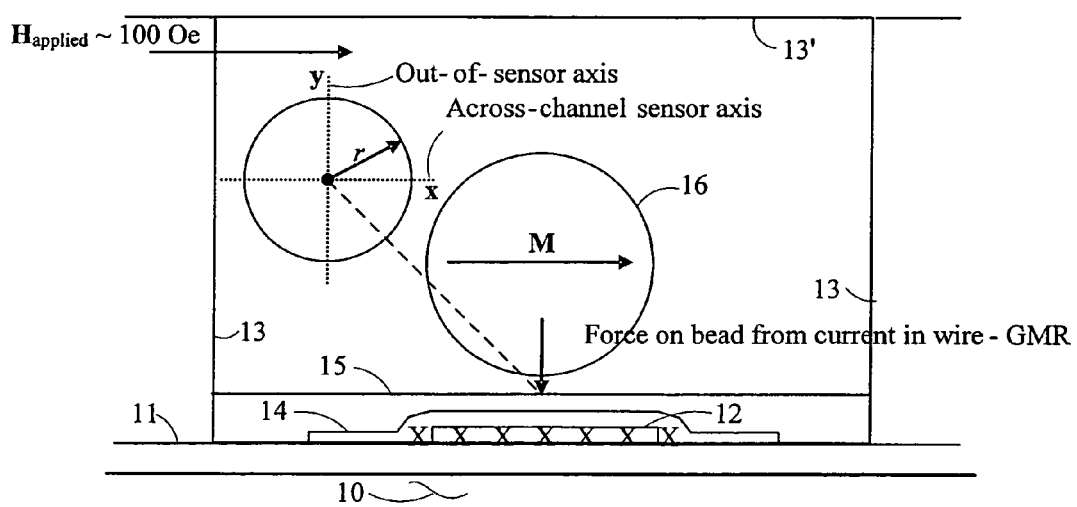
FIG. 2 shows a fragmentary cross section representation of the device structure of FIG. 1.
Figure 3:
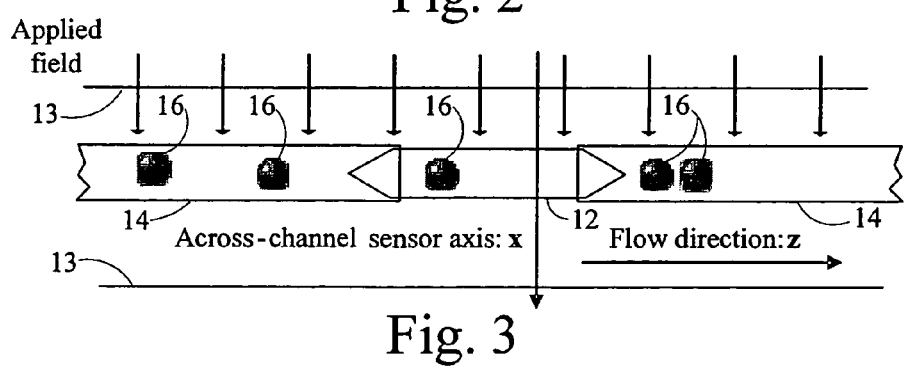
FIG. 3 shows a fragmentary top view representation of the device structure shown in FIG. 1.

An arrangement representing an implementation of the structures described in the foregoing is shown in FIGS. 1 through 3 for detection of individual magnetic material particles in a flow thereof due to their being entrained in a moving fluid with FIG. 1 providing a fragmentary perspective view of the arrangement in just the vicinity near the magnetic field disruption detector. There, a substrate, 10, which is not shown, supports the flow channel and detector arrangement, this substrate being any of an inert material, a monolithic integrated circuit with circuitry therein to operate the detector, or some other suitable base.

A silicon nitride layer, 11, is provided over the substrate to support a GMR magnetic field sensor, 12, having tapered or triangular shaped ends, and to further support the flow channel side walls, 13, so as together form a basic structural channel. Side walls 13 in turn support a channel cover, 13' as indicated in FIG. 2. Current strap conductors, 14, along the channel length interconnect the opposite tapered or triangular shaped ends of detector 12 with other circuitry not shown for operating this flow based magnetic material particle detection system, and those conductors extend along the channel for at least a substantial fraction of its length. A passivating, or protective, covering of a silicon nitride layer, 15, is provided over sensor 12 and conductors 14 to form the operating bottom surface of the operating flow channel set in the basic structural channel, as seen in the fragmentary cross section view of the arrangement at the middle of detector 12 in FIG. 2, but which is omitted in FIGS. 1 and 3 for clarity. Finally, a spherically shaped magnetic particle, 16, is shown over sensor 12 in these figures along with further such particles being shown in FIG. 3 in being entrained in the liquid flow in the channel though not necessarily moving at the flow rate of that liquid. A coordinates system is generally indicated in FIG. 1 having the areas of corresponding channel cross sections lying in the x-y plane with coordinate x parallel to the channel bottom and with coordinate y perpendicular thereto. Coordinate z extends from left to right along the length of the channel perpendicularly to both coordinates x and y.

The fragmentary cross section view of this channel in FIG. 2 shows therein a downward pointing arrow representing the force vector for the force applied to particle 16 by the magnetic field gradient present at that location. This gradient occurs because of the magnetic fields generated by electric currents through conductors 14 and detector 12 in the direction of current going into the plane of the view, as represented by the "X's" drawn across conductor 14 and detector 12, occurring in the presence of an externally applied substantially uniform magnetic field directed along the x axis. This field is more fully represented in the fragmentary top view of the arrangement shown in FIG. 3 where, as indicated above, a plurality of magnetic particles 16 are shown between channel walls 13 entrained in a flowing liquid provided in the channel.

The coordinate system to be used in connection with describing matters in connection with channel cross sections is shown in more detail in FIG. 2. The origin is defined to be directly above the middle of the sensor at the upper surface of protective covering 15, that is, the zero in the y coordinate is at the physical bottom of the operating flow channel. This means the sensor upper surface is at a slightly negative value in the y direction. The magnetic particle position is referenced to its geometrical center so when a particle of radius r is touching the bottom of the channel, it has a y coordinate value of magnitude r. In addition, the z axis which extends along the flow direction into the plane of the cross section view in FIG. 2 is indicated in FIGS. 1 and 3.

Turning again to describing the forces on, and trajectories of, magnetic material particles entrained in a flowing fluid system, the net magnetic force on a linearly magnetizable particle can be calculated using the second equation given in the description above. Qualitatively, this equation indicates that the particle will be attracted to the point where the B field magnitude is largest. In contrast to the description above of particles being attracted to current carrying conductors, where the current carrying conductor was assumed to be the only source of magnetic fields, the addition of other field sources can result in generating stronger and more locally controllable magnetic forces on magnetic material particles. An effective addition is the presence of a large and uniform externally applied magnetic field, as shown in FIGS. 2 and 3, as is demonstrated in the following considerations.

The magnitude of the magnetic field B due to electrical current in the special case of an infinitely long wire is given by $|B|$ (Tesla)$=\mu_o I/(2\pi)$ where $\mu_o=4\pi\times 10^{-7}$ Henries/meter, A is the vector distance away from the wire, and I is the magnitude of the electrical current in the wire in Amps. The orientation of B due to this current in the wire is always perpendicular to the wire and to the vector distance and has an algebraic sign according to the right hand rule. This infinite wire approximation is appropriate when the distance from the point to the wire is much larger than the wire diameter, but much smaller than the length of the wire. These conditions are true in the outer and upper regions of the microfluidic channel.

Because of the radially symmetrical nature of the magnetic field due to the conductor just beneath the channel, the field is simpler to describe in terms of A, $\theta$, and z (cylindrical coordinates). Take the y axis as $\theta=0$, the $-$x axis as $\theta=-90$, and the $+$x axis as $\theta=+90$. Also, $n_A$ is the unit vector in the direction of A, $n_\theta$ is the unit vector in the direction of $\theta$, $n_z$ is the unit vector in the direction of z, $n_x$ is the unit vector in the direction of x, and $n_y$ is the unit vector in the direction of y. A, $\theta$, x, y and z are the scalar values of the vectors A, $\theta$, x, y and z, respectively, and carry both magnitude and algebraic sign thereof.

Far away from the conductor, the conductor can be considered to be at the origin of the coordinates. Then the field in the channel can be rewritten as:

$B_x=[\mu_o I/(2\pi)\cos\theta]+B_{applied\text{-}x}$ and $B_y=[\mu_o I/(2\pi A)\sin\theta]+B_{applied\text{-}y}$. The force magnitude for two situations where the magnetic material particle is far away from the wire can be calculated. Assume that $B_{applied}$ is uniform and along the x-axis, so $B_{applied\text{-}y}=0$. With $F_{mag}=[V\chi 2\mu_o]\nabla(B^2)$ as above, $$B^2 = B_x^2 + B_y^2$$
$$= (B_{applied\ x})^2 + 2(B_{applied\ x})[\mu_o I/(2\pi A)\cos\theta]+$$
$$[\mu_o I/(2\pi A)\cos\theta]^2 + [\mu_o I/(2\pi A)\sin\theta]^2$$
$$= (B_{applied\ x})^2 + 2(B_{applied\ x})[\mu_o I/(2\pi A)\cos\theta] + [\mu_o I/(2\pi A)]^2,$$
$$F_{mag} = [V\chi/2\mu_o]\nabla(B^2)$$
$$= [V\chi/2\mu_o][n_A d(B^2)/dA + n_\theta(1/A)d(B^2)/d\theta +,$$
$$n_z d(B^2)/dz]$$
$$F_{mag\ A} = n_A[V\chi/2A\mu_o]\{-2(B_{applied\ x})[\mu_o I/(2\pi A)\cos\theta] - 2[\mu_o I/(2\pi A)]^2\},$$
$$F_{mag\ \theta} = n_\theta[V\chi/2A\mu_o]\{-2(B_{applied\ x})[\mu_o I/(2\pi A)\sin\theta]\}, \text{ and}$$
$$F_{mag\ z} = 0.$$

In the top center of the channel, $\theta=0$. So the forces simplify to:

$F_{mag\ A}=[V\chi/2A\mu_o]\{-2(B_{applied\ x})[\mu_o I/(2\pi A)]-2[\mu_o I/(2\pi A)]^2\}$ and $F_{mag\ \theta}=0$.

In the bottom left corner of the channel, $\theta=-90$. So the forces simplify to:

$F_{mag\ A}=-2[V\chi/2A\mu_o][\mu_o I/(2\pi A)]^2$ and $F_{mag\ \theta}=+2[V\chi/2A\mu_o][\mu_o I/(2\pi A)](B_{applied\ x})$.

In the top center channel ($\theta=0$) situation, only the A component is nonzero, meaning the force and trajectory are directly down toward the conductor along the A vector. In the channel corners, there are both A and $\theta$ components of the magnetic force. The A component is, again, directly towards the conductor. The $\theta$ component, however, is perpendicular to the A component, and directed away from the channel bottom. One way to understand this is to see that, at a fixed distance from the conductor, the field magnitude is always largest at $\theta=0$ because there $H_{applied}$ and the wire field are exactly parallel. As indicated above, the tendency of the particle is to move toward the region of largest field magnitude. The trajectory of a particle in the bottom corner is a combination of upward and toward the conductor motions. As the particle gets further from the channel floor, $\theta$ gets closer to zero, and the $\theta$ force component decreases. At the same time, the A force component increases as the distance from the conductor decreases. In any event, while the detailed trajectory of a particle attracted from the corner to the conductor is more complicated than that of one attracted from the center top, the net result is that the particle is always in motion toward the conductor until it hits that conductor.

The equation used above to approximate B in the channel in the vicinity of a conductor is only appropriate at values of A much larger than the conductor dimensions. The equation goes toward infinity at small values for A which is clearly non-physical. For close-in calculations, B can be reasonably calculated using Ampere's circuital theorem:

$$\oint H\cdot dl = I.$$

The integration must be done over a closed path around a conductor. The magnetic field is approximately parallel to the surface of a long square conductor as one goes around the outside. So H and dl are parallel, and the equation, solved for H, is simply H=I/4w where w is the width and thickness of the conductor. For 0.01 Amps through a 1 µm×1 µm conductor, the H field is H=0.01 Amps/$4\times 10^{-6}$ meters=$2.5\times 10^3$ Amps/Meter and B=$\mu_0$H=($4\pi\times 10^{-7}$ Henries/meter)($2.5\times 10^3$ Amps/Meter)=$3.1\times 10^{-3}$ Tesla.

Thus, a conductor beneath the channel with a length that is largely along the channel extent is useful for directing magnetizable particles moving with a flowing fluid in the channel. This conductor attracts them and holds them near so long as the particles are in the director region. The design of this region must be such that the time for a magnetic material particle to be directed to the immediate vicinity of the conductor is less than the time for that particle in the fluid flow through the channel to traverse the entire region of the channel containing that director.

As the basis for a specific example, consider the properties of commercially available magnetic material particles and liquids:

Particle diameter: $1.0\times 10^{-6}$ meters
Particle volume: $4/3\pi(0.5\times 10^{-6}\text{ meters})^3 = 5.24\times 10^{19}$ m$^3$
Particle density: 1.4 gram/cm$^3$=1400 kg/m$^3$
Magnetic susceptibility $\chi$: 0.1
Dynamic viscosity $\eta$: 0.890 mPa·s
Channel depth: $35\times 10^{-6}$ meters
Conductor current: 0.01 Amp
$B_{applied}$: $1\times 10^{-2}$ Tesla (corresponds to 100 Oe in vacuum)

Then $F_{mag\ A}(\theta=0)=n_A[V\chi/2A\mu_o]\{-2(B_{applied\ x})[\mu_o I/(2\pi A)]-2[\mu_o I/(2\pi A)]^2\}$.

The value is found first for the factor $\mu_o I/(2\pi A)=(4\pi\times 10^{-7}$ Henry/meter$)(0.01$ Amp$)/\{2\pi 35\times 10^{-6}$ meter$\}=5.7\times 10^{-5}$ Tesla, and then $F_{magA}=n_y\{4/3\pi(0.5\times 10^{-6}\text{ meters})^3(0.1)/[(2)(35\times 10^{-6}\text{ meter})(4\pi\times 10^{-7}\text{ Henry/meter})]\}\{-2(1\times 10^{-2}\text{ Tesla})(5.7^{-5}\text{ Tesla})-2(5.7^{-5}\text{ Tesla})^2\}=9.1$ picoNewton downward in the channel.

The magnitude of the terminal velocity toward the director from the fourth equation in the description above is found from setting $t=\infty$ which yields $$F_{mag}/3\pi\eta a = 9.1\times 10^{-12} \text{Newtons}/3\pi(0.89\times 10^{-3}\text{Pa}-s)$$
$$(1\times 10^{-6}\text{ meter})$$
$$=1.1\times 10^{-3}\text{ meters/second}=110\,\mu\text{m/second}.$$

The characteristic time in the exponent in that equation is the reciprocal of the factor multiplying time in that exponent or $$m/3\pi\eta a = (\text{volume})(\text{density})/3\pi\eta a$$
$$=(5.24\times 10^{-19}\text{m}^3)(1400\text{ kg/m}^3)/3\pi(0.89\times 10^{-3}\text{Pa}-s)$$
$$(1\times 10^{-6}\text{ meter})$$
$$=87\times 10^{-9}\text{ seconds}=87\text{ ns}.$$

So, the particle in being first attracted towards the channel bottom, reaches an initial speed of about 1100 microns/second, and it reaches that speed in less than 1 microsecond (during which time it travels about 1 nm towards the attracting conductor). In this example, the characteristic time is orders of magnitude less than the time to travel to the wire. The longest time for this particle to reach the wire from the top of the channel is 35 μm/(1100 μm/second)=32×10-3 seconds. The actual time is less because the attractive force grows as the particle approaches the conductor rather than staying constant.

The design of a director region must be such that the desired particle route resulting from the directing of the particle takes place in within the time available for performing such directing. Assuming a lateral flow speed of $1\times 10^{-3}$ meters/second. The director region would have to be at least $32\times 10^{-6}$ meters=32 μm long to capture magnetic material particles in the fluid flow at the top of the channel. This is approximately the same as the channel depth. The directing force at a corner of the channel is considerably smaller, and so the resulting time required for the particle being directed from there to complete the desired route is longer. A more conservative design for the above example would have the director region extend along the channel for about 300 μm of channel length.

Figure 4:
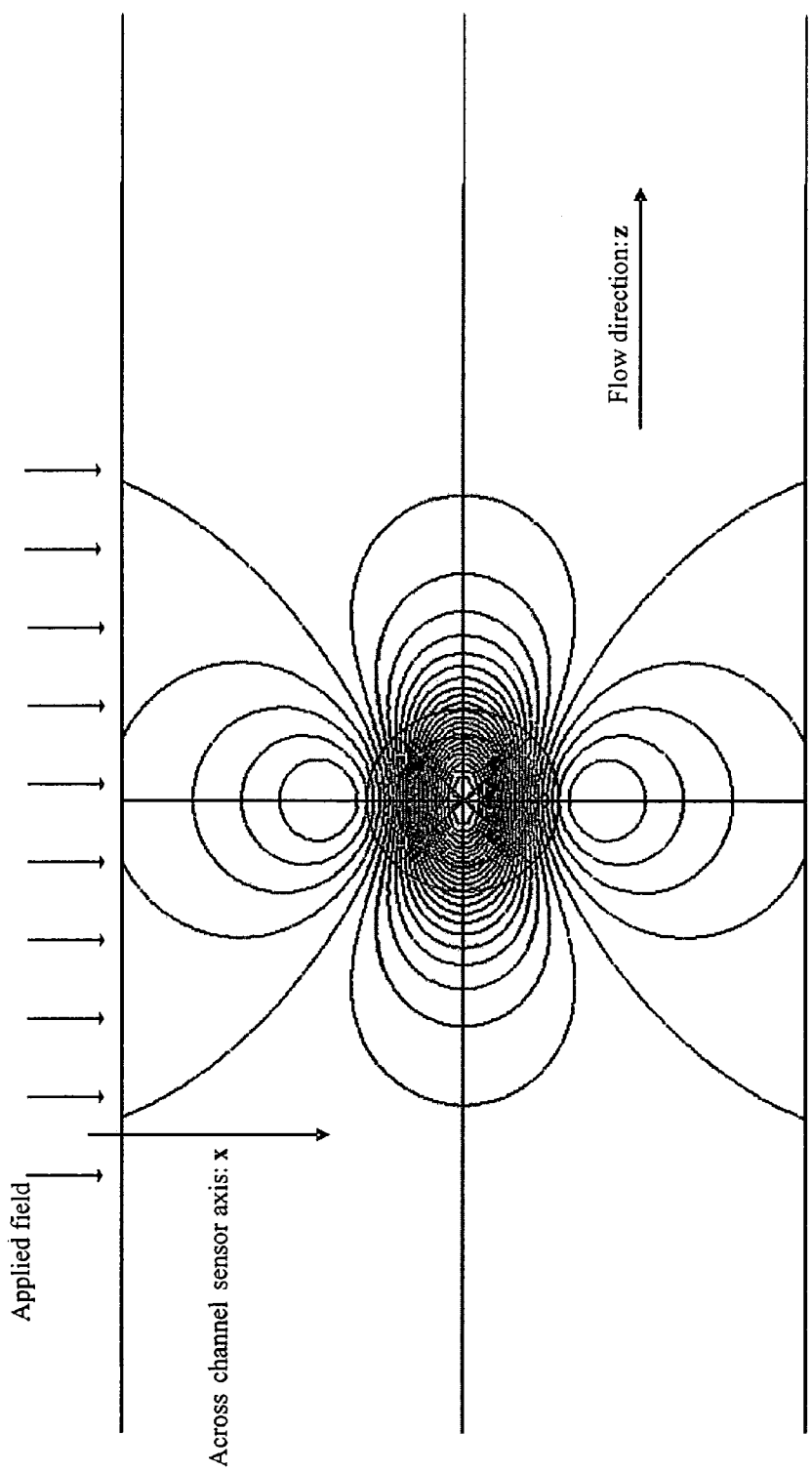
FIG. 4 shows a plot in a graph related to the device structure shown in FIG. 1.
Figure 5:
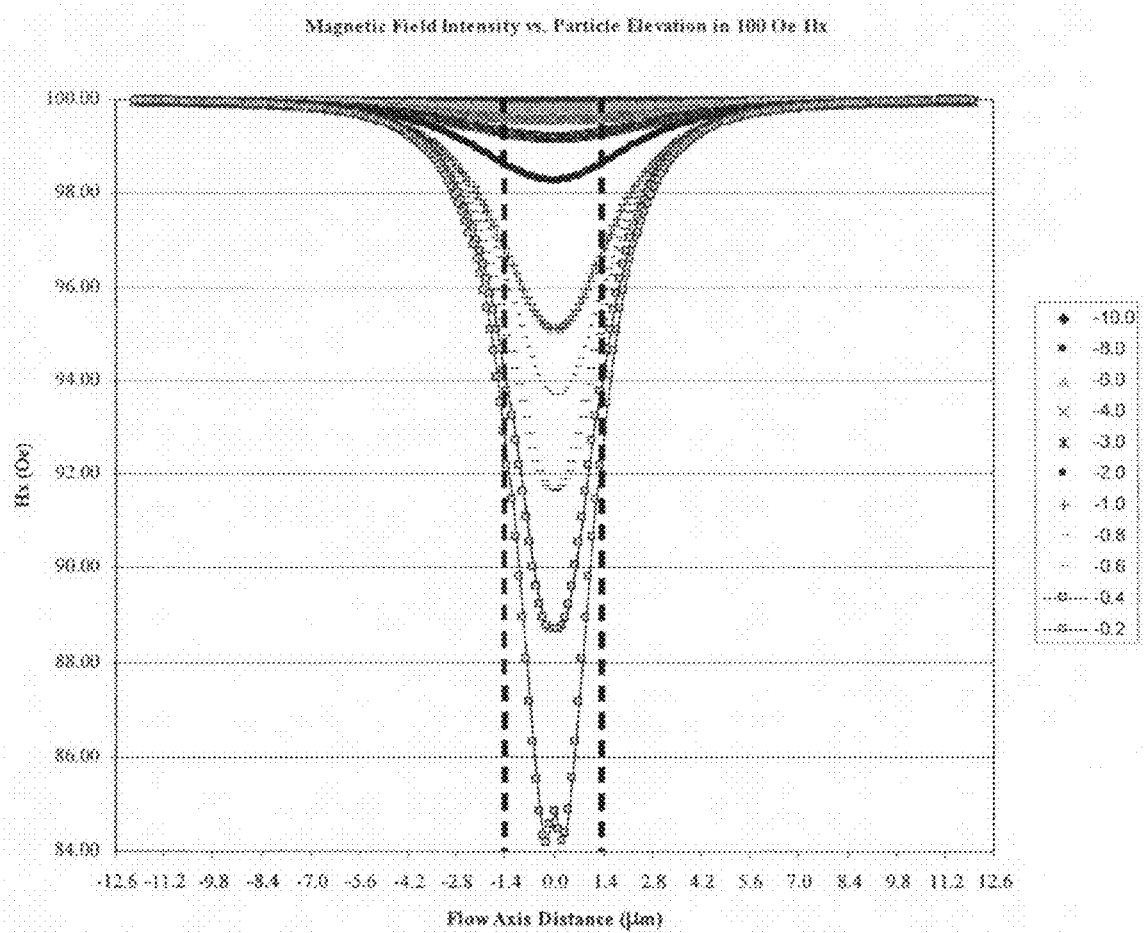
FIG. 5 shows a plot in a graph related to the device structure shown in FIG. 1.
Figure 6:
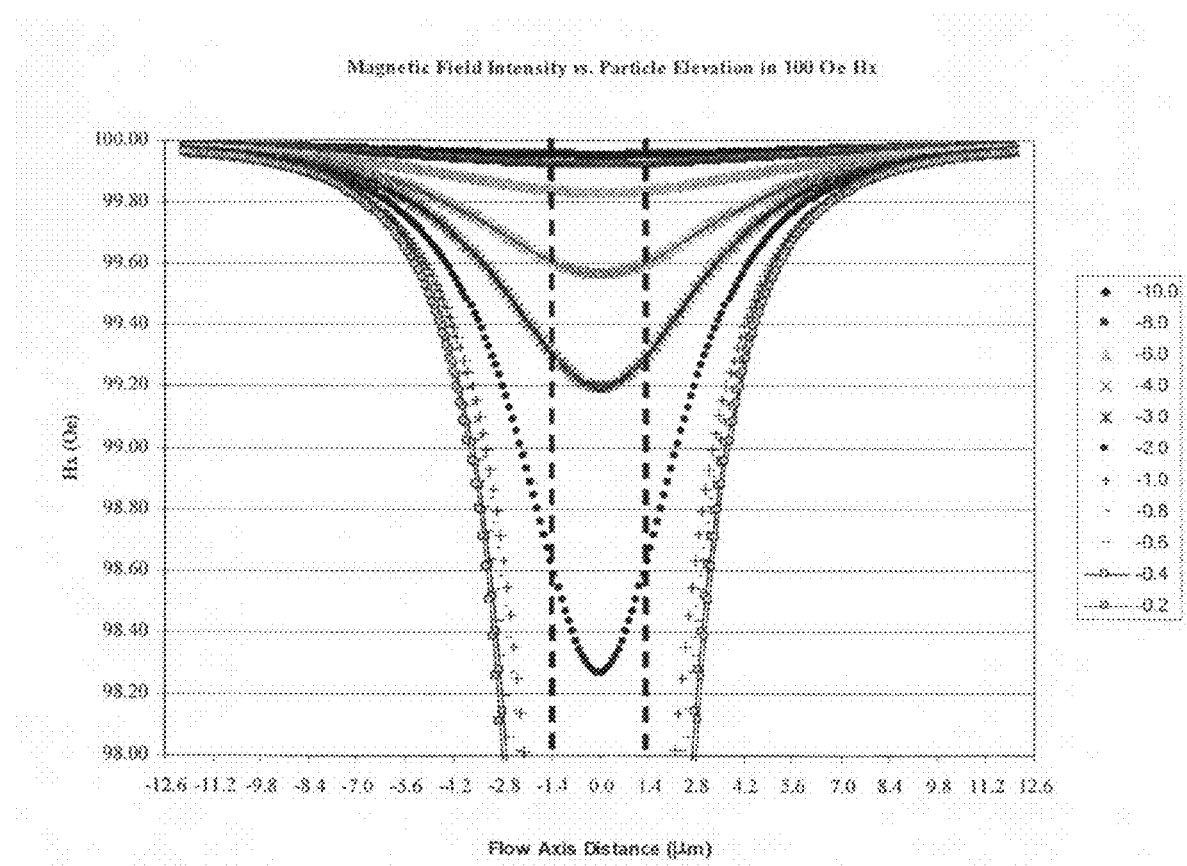
FIG. 6 shows a plot in a graph related to the device structure shown in FIG. 1 that is a portion of the graph shown in FIG. 5.

The plots shown in the graphs of FIGS. 4, 5, and 6 generally indicate what the detector output voltage versus time result would be for the event of a magnetic particle in the flow passing detector 12 assuming the detector output voltage is linearly related to the magnetic field intensity, $H_x$, along the x axis in FIGS. 1 through 3. Further assumed is that this field is uniform over the detector and that the particle velocity is constant along the z axis with a particle diameter chosen to be 2.8 μm. Such a constant velocity of the particle along the z axis in effect allows the z axis in these graphs to also be considered a time denominated axis for field measurements taken at detector 12. The plots in these three graphs are of the x axis magnetic field component in the x-z plane just above detector 12 in the situation in which a 100 Oe, substantially uniform, magnetic field is externally applied along the x axis.

FIG. 4 shows a contour plot of $H_x$ in this plane with magnetic particle 16 separated from detector 12 by 0.2 μm. FIG. 5 shows plots of $H_x$ along the z axis flow direction at the x=0 location directly below particle 16. Each plot is for particle 16 having a different elevation over the channel bottom which elevation is given in the legend in microns, the plot for an elevation of 0.2 μm corresponding to the contour plot of FIG. 4. FIG. 6 repeats a portion of FIG. 5 just showing the plots for greater elevations of particle 16.

Assuming that the dimensions of the detector surface facing the flow are 1.4 by 2.8 μm (2 squares), its electrical resistance would be about 20Ω. Using 1 mA of excitation current through the detector, the total voltage across the detector would then be 20 mV. Assuming a 5% resistance change over 100 Oe, or 5%/100 Oe=0.05%/Oe, the detector output signal voltage is 20 mV×0.0005/Oe=10 μV/Oe.

The Johnson noise developed in a 20Ω resistor is about 0.5 nV/$\sqrt{\text{Hz}}$. Supposing 10 times this quantity of Johnson noise at the measurement frequency (approximately 1000 Hz), the noise density including 1/f noise would be 5 nV/$\sqrt{\text{Hz}}$. Making an amplifier with a Q of 10 (frequency of measurement/bandwidth) is not too difficult allowing the assumption of a bandwidth of 100 Hz. Then the root-mean-square (rms) noise in the measurement band is (5 nV/$\sqrt{\text{Hz}}$)×($\sqrt{100\text{Hz}}$)=50 nV. Thus, the effective field noise is 50 nV/10 μV/Oe=5 mOe rms. Considering FIG. 5, the signal from a magnetic particle 1 μm away from detector 12 is about 5 Oe, so the signal to noise ratio to detect this 2.8 μm particle is about 5/0.005, or 1000:1. The foregoing signal-to-noise analysis does not consider motion or the uncertainty in particle elevation above the channel bottom, nor the difficulty in getting the particle to pass detector 12 at a relatively low elevation above it.

Figure 7:
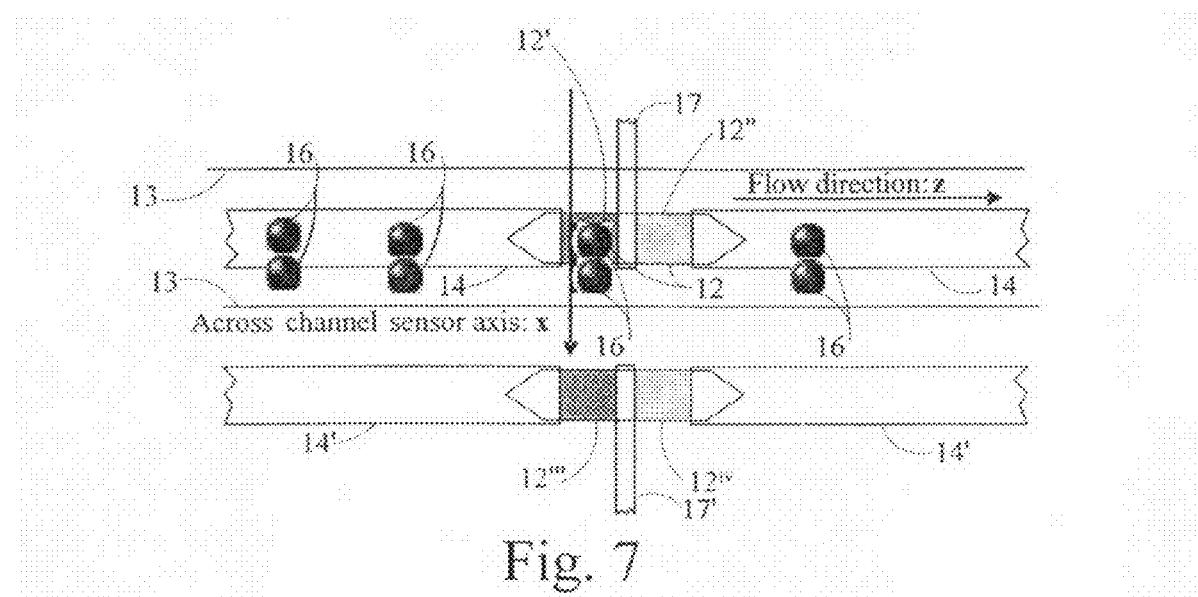
FIG. 7 shows a fragmentary top view representation of the device structure shown in FIG. 1 as in FIG. 3 but with further structure.
Figure 8:
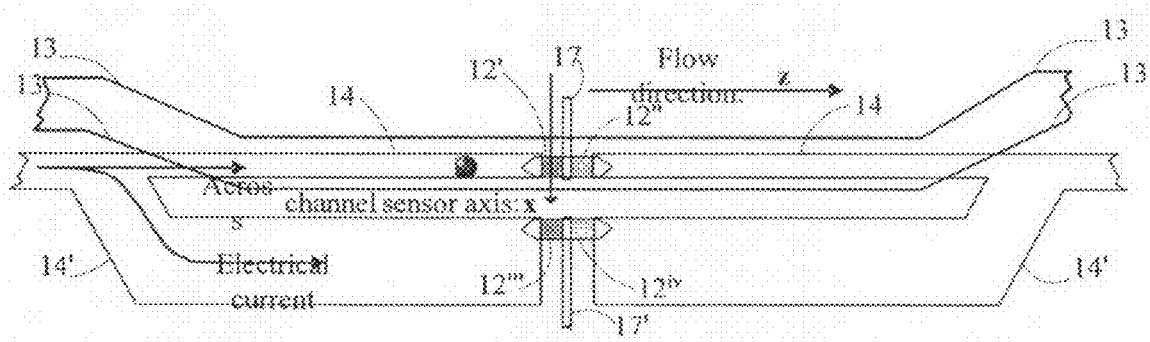
FIG. 8 shows a fragmentary top view representation of the device structure shown in FIG. 1 as in FIGS. 3 and 7 but with further structure.

Although there are many geometrical and circuit arrangements for GMR detector 12, FIGS. 7 and 8 show such a detector formed as a bridge circuit with four GMR magnetoresistors, 12', 12", 12''' and 12$^{iv}$, in the four legs of that bridge circuit. Conductors 14 interconnect magnetoresistors 12' and 12" in the channel, while further conductors, 14', interconnect magnetoresistors 12''' and 12$^{iv}$ as seen in the fragmentary top view portion of the arrangement shown in FIG. 7 where just a portion of the bridge circuit is shown. A bridge circuit output signal interconnection, 17, divides the larger magnetoresistor extending between conductors 14 into two magnetoresistors 12' and 12" both positioned below the operating flow channel bottom to form detector 12. A further bridge circuit output signal interconnection, 17', divides the larger magnetoresistor extending between conductors 14' into two magnetoresistors 12''' and 12$^{iv}$ with both these serving as circuit as references positioned outside of the operating flow channel under one of the channel wall structures 13 so as to not have electrical currents established therethrough generate corresponding magnetic fields affecting particles 16 entrained in the liquid in the channel flowing sufficiently to cause them to pass by detector 12.

A more complete showing of the bridge circuit is shown in FIG. 8 where the portions of conductor 14 and conductor 14' on the left of magnetoresistors 12' and 12''' in that figure merge into one another outside of the operating flow channel, and where the portions of conductor 14 and conductor 14' on the right of magnetoresistors 12" and 12$^{iv}$ in that figure also merge into one another outside of the operating flow channel. Thus, the bridge legs on the left, joined through the left side conductors merger, and the bridge legs on the right, joined through the right side conductors merger, in this circuit are formed so as to have these two conductors merger locations each occur outside of the operating flow channel. These two conductors mergers provide locations for a splitting of the supplied bridge electrical current to occur between the two series connected magnetoresistors 12' and 12" under the operating flow channel and the two series connected reference magnetoresistors 12''' and 12$^{iv}$ positioned outside of that channel. These merger locations occur at positions far enough away from detector 12 to allow conductors 14' and magnetoresistors 12''' and 12$^{iv}$ to be sufficiently far from the region of detector 12 and portions of conductors 14 nearby so that the fraction of bridge current therethrough does not generate magnetic fields that would significantly affect particles 16 in these regions. The additional width of conductors 14' reduces current density therethrough to again reduce the generating of magnetic fields which could affect particles 16 in the vicinity of detector 12, and the relative narrowness of conductors 14 in the channel serves to increase the magnetic field gradient thereabout.

The output voltage signal from the bridge is substantially zero in value in the absence of a magnetic particle proximate detector 12 because of the balanced electrical currents in the two sides of the bridge circuit between the conductors merger locations in these circumstances. As a particle 16 passes over the region of magnetoresistor 12' in being entrained in liquid flowing in the operating channel, this output voltage signal will become negative, and will then become positive as it subsequently passes over the region of magnetoresistor 12". If output voltage interconnection 17 between these two magnetoresistors in the detector channel bridge legs is relatively narrow compared to the particle size and those the lengths of bridge circuit legs in the channel, the output signal voltage waveform in connection with single magnetic particle passing over the detector will, to a degree, approximate a full sine wave.

Figure 9:
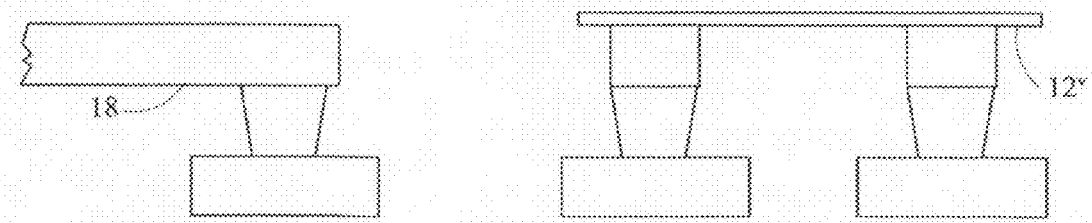
FIG. 9 shows a fragmentary cross section representation of an enhancement to the structure of FIG. 1.

The detector configuration can be varied and enhanced. An advantage can be obtained in some circumstances by electrically separating the magnetic detector and director. This arrangement is shown in FIG. 9. There, a magnetic flow director, 18, is shown on the left of the fragmentary cross section view, and a GMR magnetic flow detector, 12$^v$, is shown on the right. From bottom to top in each device, there are shown an Al metal layer, a W plug in a via in an electrical insulating layer on the first Al layer, another Al metal layer on the plug, and a GMR detector film layer in device 12$^v$ on the right and, above both magnetic flow director 18 and GMR magnetic flow detector 12$^v$, the bottom surface of the flow channel formed by the top of layer 15. Not shown in any detail is the electrical insulating material structure surrounding the metal and GMR layers beneath the channel bottom surface. The arrow above the bottom of the channel indicates the direction of fluid flow in the channel.

One advantage in separating magnetic flow detector 12$^v$ and magnetic flow director 18 is that the electrical current magnitude requirements may be different for the two devices in view of their different purposes. For example, the GMR resistor may be able to handle only 2 mA without generating significant internal heat. The director wires are much thicker than the GMR resistors, and the magnitude of force applied by them is proportional to the electrical current, and hence currents of magnitudes around 50 mA may be desired in some situations for director 18.

Another advantage in separating magnetic flow detector 12$^v$ and magnetic flow director 18 is the ability to operate them independently. One example is choosing to switch the algebraic sign of the applied magnetic force in a director through switching the direction of electrical current therethrough without concurrently changing the operation of the detector. Another advantage is that director 18 may be a composite of more than one wire, and so be too complicated to conveniently be attached to detector 12$^v$.

Figure 10:
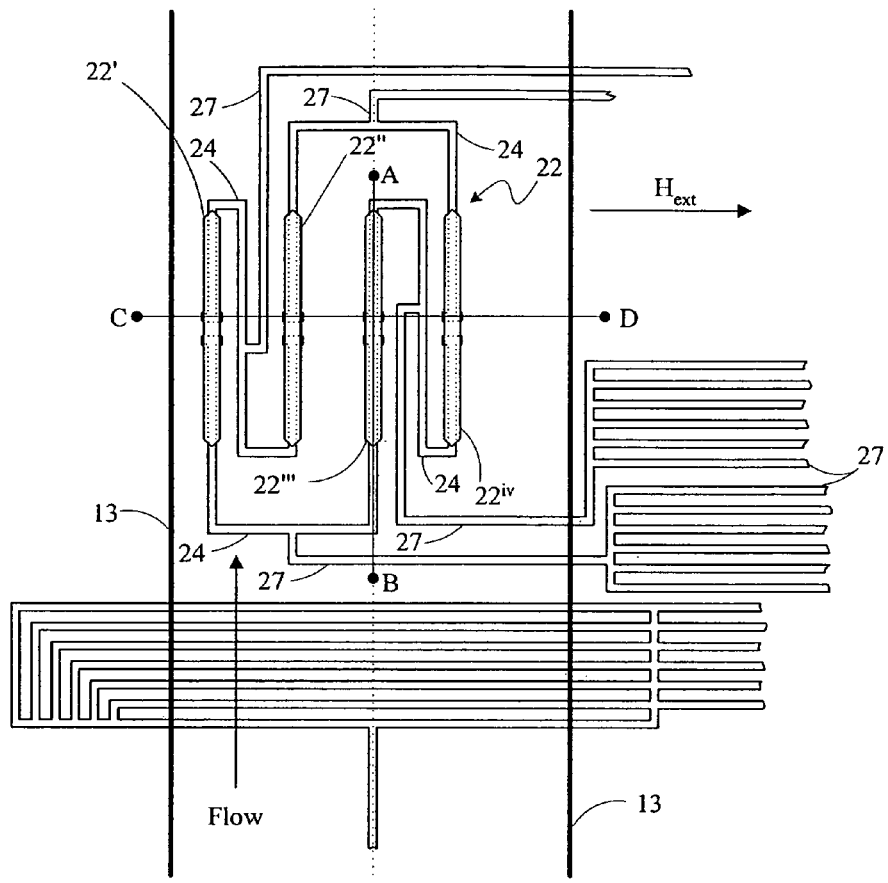
FIG. 10 shows a fragmentary top view representation of a device structure embodying an alternative of the present invention.
Figure 11:
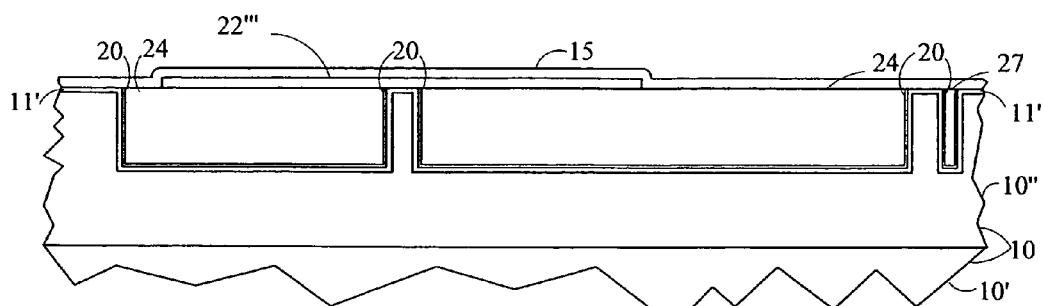
FIG. 11 shows a fragmentary cross section representation of the device structure of FIG. 10.
Figure 12:
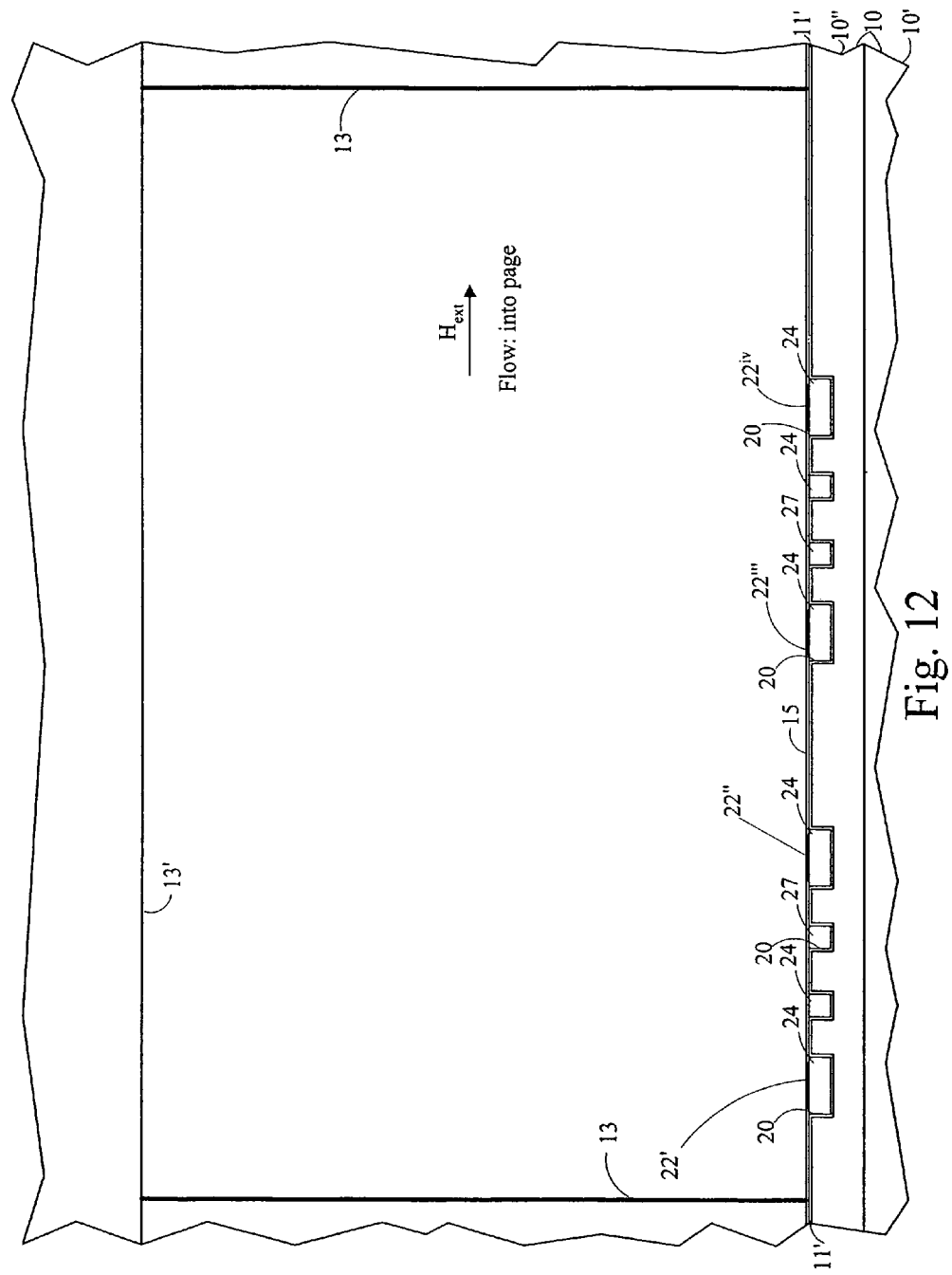
FIG. 12 shows a fragmentary cross section representation of the device structure of FIG. 10.

FIGS. 10 through 12 show another detector configuration, 22, with four GMR magnetoresistors, 22', 22", 22''' and 22$^{iv}$, suitably connected in the legs of a bridge circuit. Magnetoresistors interconnection electrical conductors, 24, interconnect these four magnetoresistors resistors, and four further external connection electrical conductors, 27, connect interconnection conductors 24 to external operating circuitry (although on the same integrated circuit chip) for purposes of supplying electrical current to the detector and transmitting voltage signals to that external circuitry. The intersections chosen for the meetings of conductors 27 and 24 are the locations that result in the resistance contributed to the Wheatstone bridge by interconnection conductors 24 being equal in each of the four bridge circuit legs. This is especially important when the total resistance of the GMR sensor is relatively low which can be as small as being on the order of 50Ω. Since all conductors are to be fabricated with the same width to better accommodate the damascene process in which they are fabricated, the ends of conductors 27 away from conductors 24 are provided in multiple more or less parallel conductors where there is a desire to reduce the effective resistance along the corresponding current path.

FIG. 10 is representation of a top view of a portion of the flow channel at which the bridge circuit detector is located with lid 13' and insulating layer 15 omitted, and with those portions of the structure materials forming channel side walls 13, these walls being shown as heavy lines in these figures to leave these wall structure materials of course outside the channel to the right and left of the heavy lines, being shown as being transparent to avoid obscuring the structures beneath. The line connecting points A and B in FIG. 10 is along the path that a directed magnetic particle would take through the detector region. This line also marks the cut along which the representation shown in the layer diagram of FIG. 11 is provided of a portion of the structure in FIG. 10 (omitting the channel wall behind this cut) with point A of FIG. 10 being to the left in FIG. 11. The line connecting points C and D marks the cut along which the representation shown in the layer diagram of FIG. 12 is provided of a portion of the structure in FIG. 10 (omitting any channel wall structure behind this cut) with point C of FIG. 10 being to the left in FIG. 12.

Flow channel sidewalls 13 can be spaced from 5 μm to hundreds or even thousands of microns apart (50 μm being typical) with the channel depth being from a few microns to hundreds of microns (35 μm being typical). The GMR magnetoresistors are typically 2 μm wide and the interconnections are typically 1 μm wide. The bridge is positioned so that one of the four GMR magnetoresistors, 22''', is underneath the path that directed magnetic particles are most likely to take as a result of the influence of the director. This path is shown in the figure to have been chosen to be in the center of the channel though this is not a requirement.

The modified GMR sensors are electrically connected to one another and to external circuitry by overlapping the structures of GMR magnetoresistor 22', 22", 22''' and 22$^{iv}$ directly over entrenched Cu interconnection conductors 24 but with the upper surfaces thereof exposed except as covered by such magnetoresistors or by layer 15 provided to form the operating bottom surface of the operating flow channel set in the basic structural channel. The starting point for the fabrication process leading to these structures is a silicon wafer, 10', as part of substrate 10 which wafer may have monolithic integrated circuits therein providing capabilities for operating the directors and detectors, and for amplifying and processing detector signals. The silicon wafer so formed is coated with a layer of a positive photoresist polymer material, 10", the material being B-staged bisbenzocyclobutene (BCB), to a thickness of approximately 2 μm to complete substrate 10. Recesses of the shape and depth that conductors 24 and 27 are intended to take are etched into the BCB using standard photolithography techniques and reactive ion etching (RIE) to form substrate 10. The recesses are about 1 μm deep.

A silicon nitride layer, 11', about 40 nm thick is deposited over all of the recessed layer of BCB and so into the recesses. A thin adhesion layer, 20, of about 4 nm of Ta is deposited over the entire nitride layer 11' and so into the recesses. The material for magnetoresistor interconnection conductors 24 and external connection conductors 27 is electroplated Cu, which is plated on in a thick blanket (~2 microns) over all of adhesion layer 20 and so again into the recesses. A chemical mechanical polishing (CMP) tool is used to remove unwanted Cu and Ta from the wafer, leaving Cu and Ta only in the recesses to form conductors 24 and 27 in this damascene process, and leaving also the exposed portions of silicon nitride layer 11' on the top of BCB layer 10" where not recessed.

The GMR magnetoresistor structures films are deposited and patterned in a well known manner to leave film structures that are about 30 μm long and 2 μm wide that serve to provide the desired GMR magnetoresistors 22', 22", 22''' and $22^{iv}$ resulting over the gaps between magnetoresistor interconnection conductors 24. Remaining portions of these film structures are on the corresponding portions of conductors 24 to thus be electrically shorted by these conductor portions so that the magnetoresistors indeed occur just over the gaps between the various interconnection conductors 24. The film structures width versus length aspect ratio is a component of their magnetic design, which affects the performance of the sensors in terms of hysteresis and sensitivity (mV per unit applied magnetic field). Passivating film 15 is formed by depositing silicon nitride in a vacuum sputtering system to a thickness of about 10 nm. Other dielectrics such as silicon dioxide can instead be substituted therefor.

These layer diagrams in FIGS. 11 and 12 give an indication of the structural layers leading to the structures shown in FIG. 10 but are not true cross-section views in that many dimensions are exaggerated or reduced for purposes of clarity. The dashed lines in FIG. 10 show the extent of conductors 24 under the GMR magnetoresistors. These conductors are slightly wider at their ends in order to assure that the sensing regions of magnetoresistors 22', 22", 22''' and $22^{iv}$ are well defined geometrically. Again, this region of the film structure over the gap between conductors 24 is the only part of that structure providing a GMR magnetoresistor that contributes to signals related to magnetic condition changes thereabout because the remainder of the magnetoresistor is effectively shorted out by the much thicker Cu in interconnection conductors 24.

FIG. 12 shows a layer diagram, as indicated above, across GMR magnetoresistor bridge circuit detector 22 under the microfluidic channel between side walls 13 at the cut indicated by the C-D line in FIG. 10. Channel walls 13 are shown in thick vertical lines. These channel walls are formed by spinning on photodefinable epoxy, SU-8, to a thickness of about 35 μm, and then exposing the desired portions to UV light through a lithographic mask, and thereafter removing the unexposed material from the channels in the channel walls structure with a suitable developer solvent. Channel lid 13' is formed by the bonding of a patterned SU-8 cover that is about 50 μm thick to the completed channel walls structure.

There are several advantages to using the above described fabrication process. The topological profile of the GMR sensor in the flow channel is very small, about 10 nm. And the profile of the associated interconnections and director conductors is essentially zero nm. This means that there is little disturbance of the flow as it passes over the GMR sensor region. Very small magnetic particles can come extremely close to the detector and director without getting snagged or trapped by the bumps there. Another advantage is the great freedom of device design. Because the Cu conductors are beneath the channel surface, the channels can be of arbitrary width and orientation with respect to the detectors, directors, and associated circuitry. The SU-8 UV-curable epoxy is also very versatile for channel formation. It can be spun on and exposed in thicknesses ranging from <2 microns to 1000 microns. The aspect ratios can be much greater than 1, and the sidewalls of this material are rather sharp. Furthermore, the SU-8 cured epoxy is fairly impervious to water, biological buffers, and organic solvents. This is a great improvement over other means of forming channels such as PDMS, which absorbs water and gas. The wafer-to-wafer SU-8 bonding procedure for forming lids also leads to the ability to have multi-layer wafer-scale fluidic structures on the sensor chip.

Figure 13:
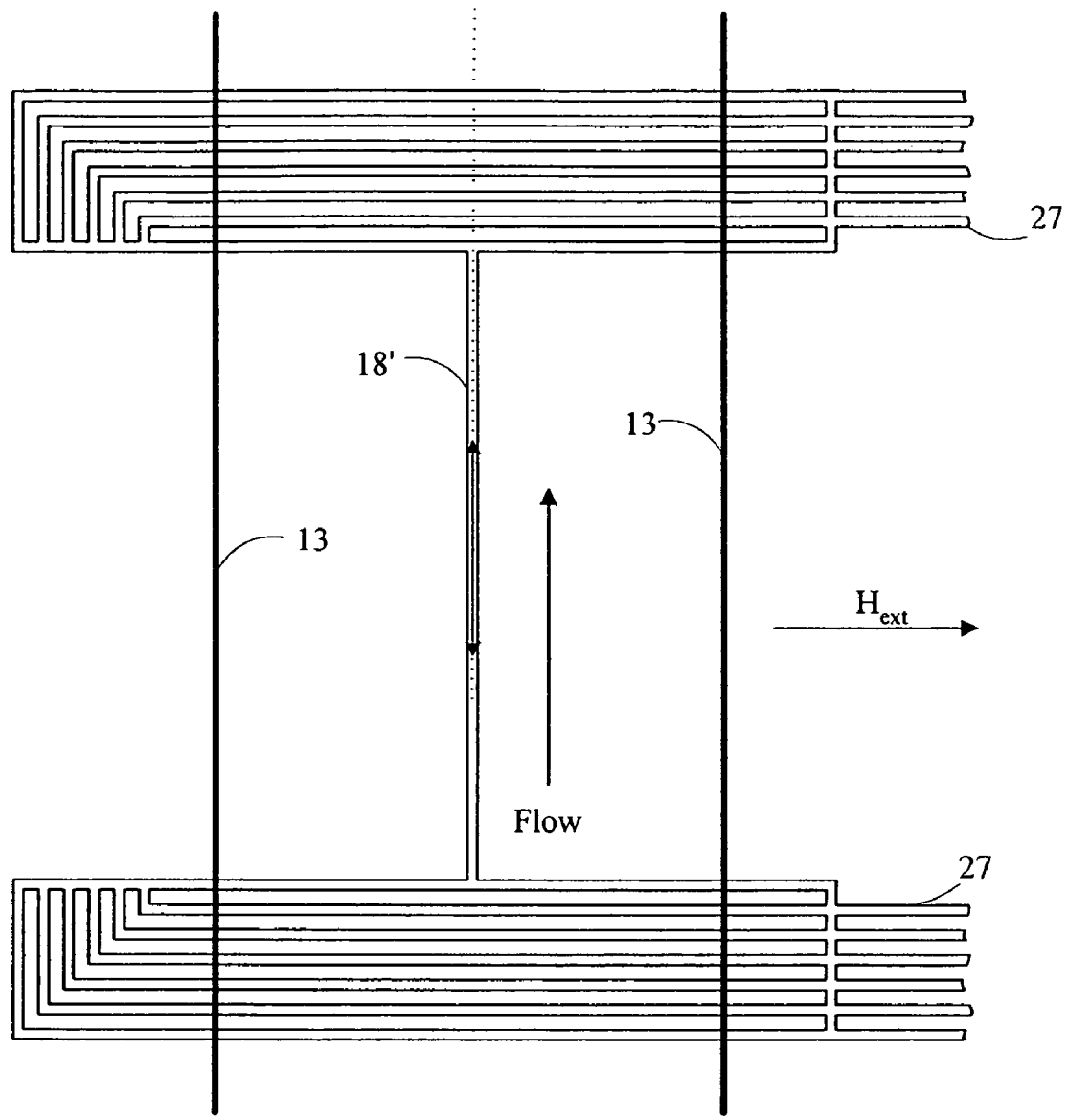
FIG. 13 shows a fragmentary top view representation of an enhancement to the present invention.

FIG. 13 shows a representation of top view of another implementation of magnetic particle director 18 under a microfluidic channel defined by side walls 13 using the same omission and transparency conditions used with FIG. 10. A director, 18□, is formed of a damascene process Cu conductor elongated in the direction of extent of the channel in the flow direction using the same fabrication process as used for the interconnection conductors 24 provided with detector 22.

In situations in which an applied external field $H_{ext}$, as indicated in FIG. 13, is much greater than the field generated by electrical currents established in director 18', the magnetic field force generated on a particle in the channel is much larger utilizing a conductor for the director extending parallel to the channel extent in the flow direction, and so perpendicular to the direction of $H_{ext}$ than for a conductor extending parallel to the direction of $H_{ext}$. The magnetic field based force is attractive with respect to the conductor if the field $H_{cond}$ generated by the conductor electrical current adds to $H_{ext}$, and repulsive when $H_{cond}$ subtracts from $H_{ext}$. The algebraic signs and magnitudes of $H_{cond}$ are controlled by the algebraic signs (or direction) and magnitudes, respectively, of electrical currents established in director 18' with typical current directions being indicated by the double headed arrow in the conductor.

The interconnections conductors 27 for connecting director 18' to external circuitry, provided at the opposite ends of director 18' under the channel, are designed to form a current path away from the field concentration region that minimizes forces acting on the magnetic particles in the channel due to the fields generated by the corresponding currents in those interconnections. For example, the conductor forming director 18' splits two ways taking right-angle turns because current in wires along these directions will not generate appreciable magnetic forces as indicated above. The conductor is divided into six parallel conductors in order to further minimize the stray fields from the conductor end structure, and to minimize the electrical resistance. As indicated above, wider conductors are formed this way rather than by making a solid wider conductor because the CMP tool for Cu removal in the fabrication process following the blanket Cu plating operates best when all the conductors are the same width.

The channel shown in FIG. 13 is again typically 50 µm wide. The channel length, and the length of the director therein, can both be much longer relative to the channel width than is represented here. Such a director must be long enough to attract magnetic particles towards it sufficiently in the time during which those particles are in the director region in the fluid flow past it, and the channel must be long enough to accommodate all of the particle manipulation and sensing devices needed to perform the desired operations on the magnetic material particles entrained in the fluid flow therethrough. A typical director length is about 400 µm.

Figure 14:
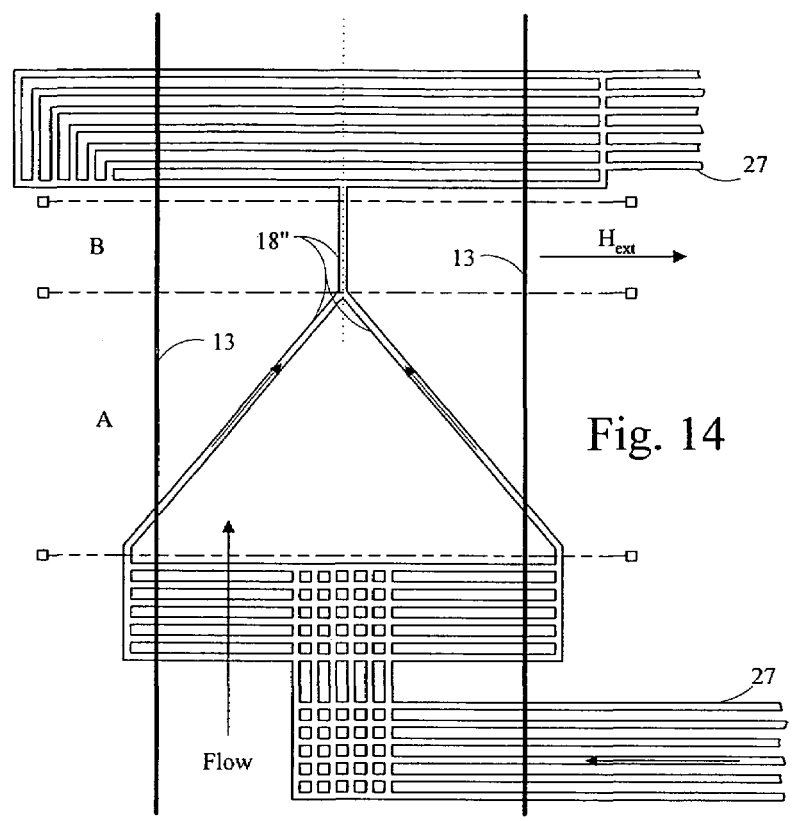
FIG. 14 shows a fragmentary top view representation of an enhancement to the present invention.

A further alternative embodiment for director 18 for directing the routes of magnetic particles in the channel is represented in the top view shown in FIG. 14 again using the same omission and transparency conditions used with FIG. 10. Here, the director structure used in FIG. 13 is combined with a "gathering" device to form an extended director, 18", again in the channel established between side walls 13 represented again by bold lines in FIG. 14. The gathering device is shown by two conductors extending from external interconnections conductors 27 entering the channel from opposite sides thereof and extending toward one another over the length of the section of the channel designated "A" in which this gathering device is shown, beginning at the conductor entries, to eventually merge together at the opposite end of this section. Section A, with typical current directions being indicated by the arrows in the conductors therein, is followed by a further section of the channel designated "B" where the merged conductors of section A extend as a single conductor parallel to the extent of the channel in the flow direction to further external interconnections conductors 27 to form a FIG. 13 type of director in this last section. As in FIG. 13, the length of sections A and B are represented much shorter than is typical, and they instead would typically be a few hundred microns in length as would then the conductors provided therein, that is, whatever length is necessary to accomplish the desired magnetic force directing of the routes of magnetic particles moving in and with the fluid flowing in the channel. The angle between the conductors in section A would thus typically leave them much closer to being parallel to one another and to the flow direction along the extent of the channel in the flow direction than does the angle shown in FIG. 14 which has been chosen for purposes of clarity there.

A wide variety of uses exist for devices that can differentiate between individual particles, on the one hand, and pairs of particles on the other that are bound together through specially designed biochemical action based binding. Particles are commonly provided with coatings that allow them to bind to DNA, proteins, or other molecules of biochemical interest, or some combination thereof. One common way to use these particles is to capture an analyte of interest on some convenient surface, and then capture the coated label particles on the "other end" of the analyte. The analyte is thus "sandwiched" between the surface and the particle label. The number of particles per unit area in this sandwich can be used as a quantitative measurement of the supply of analyte in the fluid being assayed for same.

Figure 15:
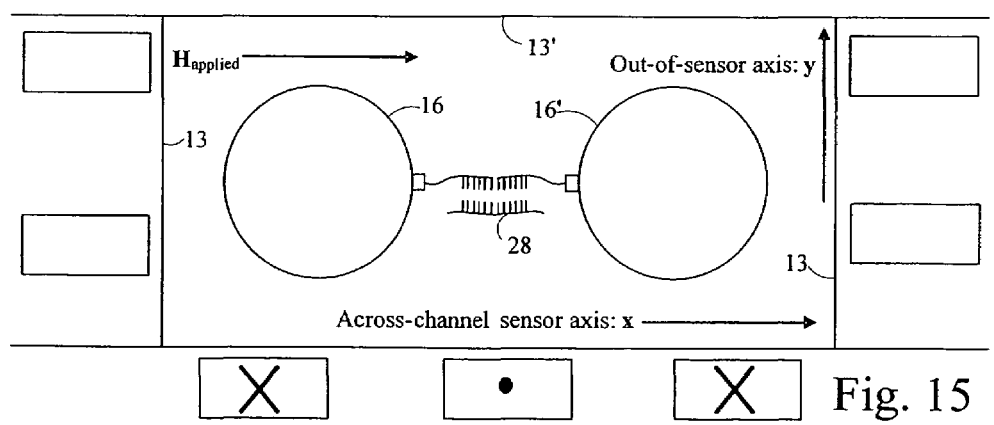
FIG. 15 shows a fragmentary cross section representation of an enhancement to the structure of FIG. 1.
Figure 16:
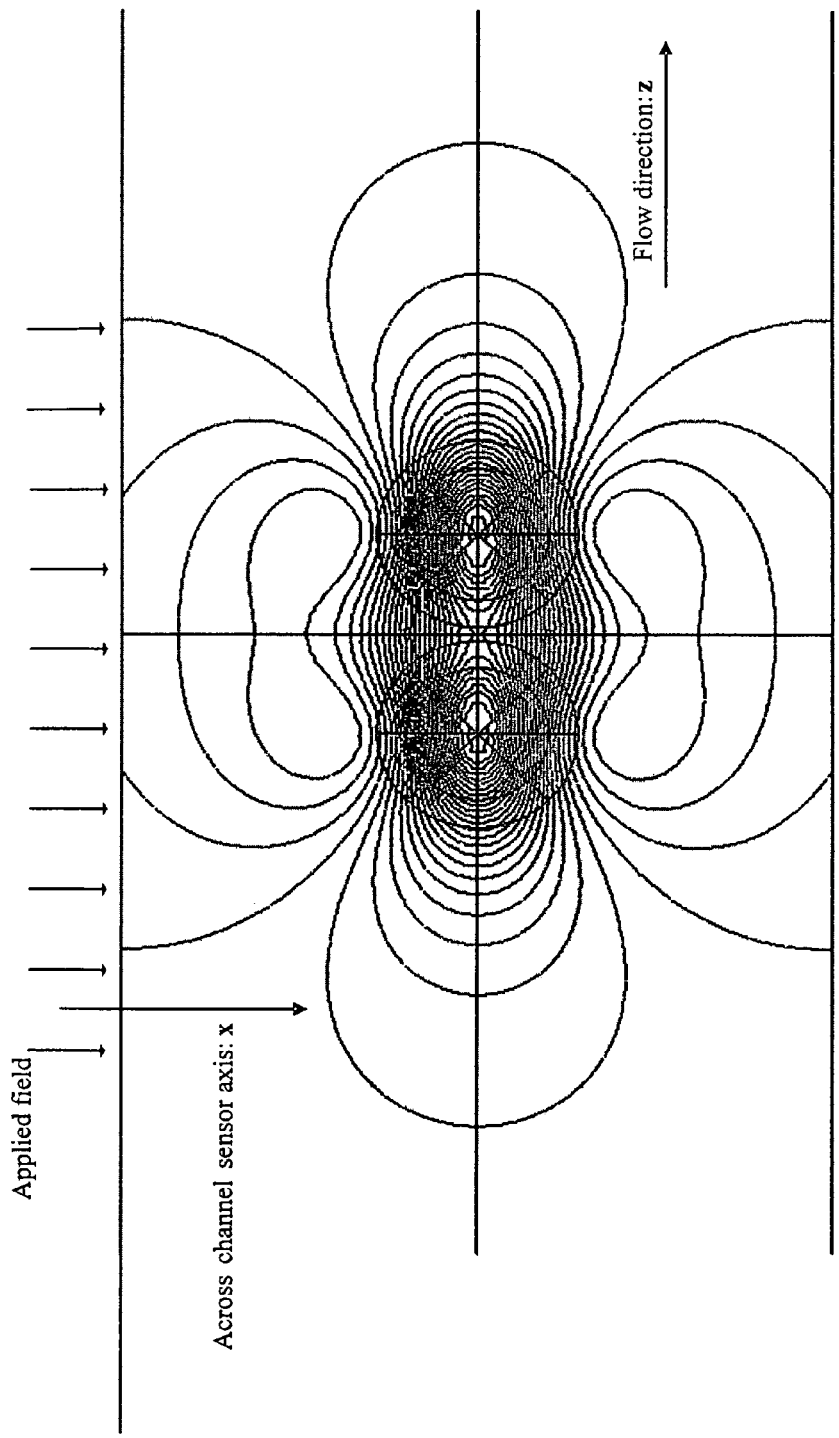
FIG. 16 shows a plot in a graph related to the device structure shown in FIG. 15.

The flow based magnetic material particle detection system described above replaces the surface indicated above (typically a flat surface, a glass slide, for instance) with another coated label magnetic material particle. Thus, two specifically prepared label magnetic material particles, bound together "sandwiching" an analyte of interest between them for which the concentration thereof in the assay fluid is to be measured, represent a countable entity whose quantity is related to that analyte concentration. A cross section view diagrammatic representation is shown in FIG. 15 of an operating flow channel having a label particle 16 along with another such label particle, 16', present in this representation thereof, and further having an analyte, 28, also being represented there. FIG. 16 shows a contour plot of $H_x$ in the x-z plane above detector 12 with magnetic particles 16 and 16' separated being from detector 12 by 0.2 µm and being closely bound to one another.

This capability can result in a general purpose biochemical assay tool where the chemistry is performed on a particle rather than on a more or less flat surface. Such assays can be performed in real time in a continuous channel flow arrangement, and the labeling particles can be recycled assuming appropriate analyte-release and label particle-recovery steps are performed.

Many desired investigations material samples of interest based on using magnetic material particles with such samples involve performing multiple operations on the particles with such samples through magnetic field manipulations of those magnetic material particles. For example, first concentrate the magnetic material particles bound in some way in some sample, and then count the number of particles in a flow of that sample. In addition, a sort of various types of magnetic particle based objects (e.g. magnetic labels in connection with biological cells having the magnetic labels on them) may be desired followed by performing a subsequent counting of the sort categories. Magnetic manipulation based devices offering multiple operations on objects based on magnetic material particles require self-consistent magnetic devices designs where sorting, concentrating, directing, and detecting functions are all to be provided on the same monolithic integrated circuit chip that is fabricated in a single manufacturing process common to all. The external field that is applied to operate the directors must also, to the extent needed operate the GMR sensors, the sorters and the concentrators, etc., or at least not prevent such operation where not needed for the operation.

This need for self-consistency in the chip structures used and their fabrication forces choosing magnetic field biasing and manufacturing processes in advance of performing chip designs. Some of these choices can seem needlessly limiting in the context of a single particle manipulation or sensing device, but are essential for chip structures with more kinds devices contained therein. For example, the externally applied magnetic field has only been described above being directed across the primary channel extent direction in the flow direction parallel to the channel bottom and perpendicular to the direction of primary channel extent and the direction of fluid flow. This does not, however, indicate that other orientations or modes of magnetic field biasing are impossible. Rather, changing the direction of the external biasing field to be across the channel in direction perpendicular to the channel bottom (along the y-axis) for example, requires redesigning the sensors, sorters, and directors. Some advantages of external magnetic field biasing shown in connection with the devices described above are that it generally allows better optical access to the chip, and simpler mechanical design of the field generation structures. Biasing field excitation along the y-axis, on the other hand, could allow larger field magnitudes with the same power, and may allow much greater field magnitudes without saturating the magnetic detector response (the detectors are typically not very sensitive to fields directed across the film stack forming the detectors).

A self-consistent design arrangement for magnetic structures and the fabrication process therefor can be described by the use of distinct "operational locations" where the various magnetic manipulation and sensing operations are being performed. For a biological cell counter, the operational locations would be those for 1) a gatherer, 2) a sorter), and 3) a detector, with the possible addition of 4) a splitter (channel splits to split flows). Each operational location is designed for a certain fluid flow rate to have the length thereof be long enough to assure that the corresponding operation is performed within the time that the magnetic objects are within the location extent. The device in each operational location is designed to have minimal magnetic influence on the devices in other operational locations in the system. The various operational locations in a chip are connected to each other through the flow channel, and in the appropriate sequence.

In microfluidic systems such as those being described herein, the flows may be characterized as being "laminar." This means that there is very little turbulence, little random action, and the fluid is carried in a very orderly fashion downstream (z-direction) without significant mixing in the x- or y-direction. Such flows mean that magnetic objects entrained therein that are within a certain region of the channel cross section on leaving one operational location in the overall flow system can be expected to stay in that region as they flow downstream to the next operational location. For example, when magnetic particles have passed through a director operation location, and they have been drawn down to the sub-region of the channel cross section at the middle and bottom before leaving that location; they can be expected to remain in the middle and bottom sub-region of the channel cross section as they are transported in the flow to pass into a detector operational location downstream. There are some important exceptions to this general rule having to do with the nature of particle interactions with channel side walls 13, and the tendency for the middle portions of a flow in a channel to have a higher flow rate than the portions near the channel walls, bottom and lid.

Distinguishing magnetic material particle pairs, or bead pairs, from single particles, or beads, requires forces to be generated in the channel that pull the label particles, or label beads, apart from each other. Typically, this is not achievable with macroscopic magnets because the influence of the magnet pulls both analyte joined beads in the same direction. Also, the applied magnetic field generates a magnetization, M, in both of the beads having the same orientation in each which tends to cause them to attract each other. Thus, a manipulation structure is needed where magnetic fields and field gradients are formed on a length scale on the order of the dimensions of the magnetic material beads. Such an arrangement will allow the directions of forces on the pair of beads to be opposite one another toward opposite sides of the operating flow channel.

In doing so, the pairs of joined magnetic material beads have to be oriented with the binding between them directed across the channel so as to each be in the channel cross section plane as shown in FIGS. 15 and 16, that is, so that the axis between the two bead centers in a joined pair thereof is oriented across the channel perpendicular to the direction of flow and not along the channel length in parallel with that flow direction. The cross section in FIG. 15 shows the basic orientation expected to be seen with a relatively large external field applied along the x coordinate as shown which achieves this orientation of the pair of joined beads. Assume that the particles have a constant linear magnetic susceptibility in the ranges of magnetic fields to be generated both externally and within the monolithic integrated circuit chip in which the channel is provided (±1000 Oe). The pair of beads will be magnetized parallel to this field, and their magnetizations will line up end-to-end perpendicular to the flow direction due to their mutual interaction (in this case, it is attractive).

Figure 17:
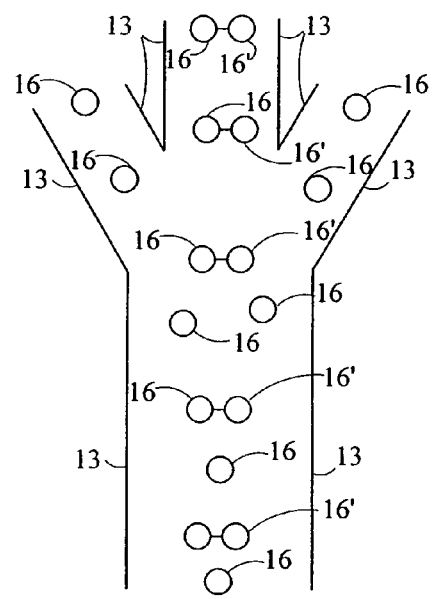
FIG. 17 shows a fragmentary top view representation of an enhancement to the structure of FIG. 15.

In these circumstances, the currents into the plane of the cross section view in the outer two conductors beneath the channel representation in FIG. 15 (each represented by an "X"), and the return current in the central conductor beneath the channel representation (represented by a "•") lead to magnetic field gradients causing forces on magnetic material particles that direct them toward the nearest one of the two channel side walls 13. Particles 16 that are merely near one another, and bound together only by the attractive force due the common magnetization direction of each because of the externally applied field along the x axis, will be separated and directed toward channel side walls 13 by forces due to the local magnetic field gradients arising from the currents in the electrical current conductors under the channel to thereby break up such pairs. However, these local magnetic field gradient forces will be insufficient to break the bonds established between label beads 16 and 16' formed therewith by analyte 28 thus leaving such pairs intact. As a result, the bead pair sorter shown in FIG. 17 can be used with the arrangement of FIG. 15 to cause single beads 16 to flow out the angled away channel portion while the still bound pairs flow out the direct line channel portion as the forces on the beads in such bound pairs net to zero on the pairs as a whole.

Figure 18:
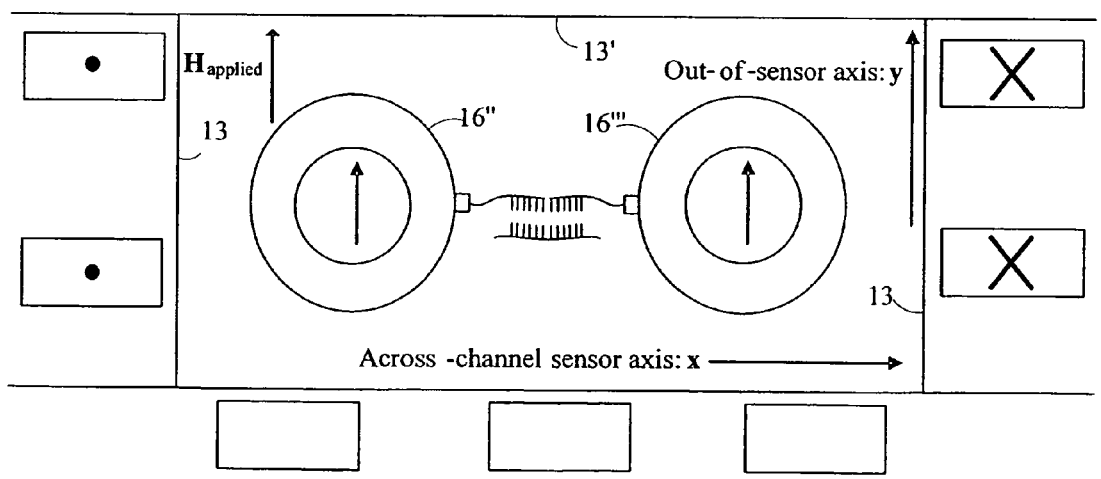
FIG. 18 shows a fragmentary cross section representation of an alternative use of the structure of FIG. 17.

Another arrangement for generating a mutually repulsive force between beads 16 and 16' applies a field out of the plane of the bottom of the channel directed upward, while keeping the beads oriented across that plane, as shown for two further beads, 16" and 16''', in FIG. 18. Then, the magnetostatic interaction between them will be repulsive. There are two problems connected with applying such an out of plane field. First is that the pair of beads will have a tendency to orient themselves such that they are reconnected along the field line. In other words, they will tend to move to orient themselves top and bottom with respect to one another rather than from side to side as what is shown here. Then the magnetizations will be end-to-end, and attractive again so that beads that are not bound with an analyte 28 will still again be magnetostatically bound. Thus, it is not clear that the beads will remain oriented side by side across the channel long enough for the repulsion to take place. Another problem is that the system gets more complicated if it must be designed for externally applied magnetic fields along two different axes, both a vertical axis for such pair sorting and a horizontal axis enabling use of detector 12.

One solution for these problems is to simply stop applying the externally applied field and establish electrical currents in conductors positioned on the channel sides as shown by rectangular shaped conductors in such positions in FIG. 18. With the electrical current going in opposite directions in the rectangular shaped conductors on opposite sides of the channel (as shown by the "X"s on the right side conductors and the "•"s on the left side conductors), beads will be attracted towards the channel walls and away from each other.

Part of the solution to the problem has to do with the relative size and magnetic content of the beads. If the beads have a magnetic core whose radius is significantly less than the total bead radius as shown for beads 16" and 16''' in FIG. 18, the nonlinear attractive effects would be reduced. Another possibility is to use particles whose magnetization is "permanent"—remaining in a fixed orientation within the material atomic structure—in the assay environment.

Figure 19:
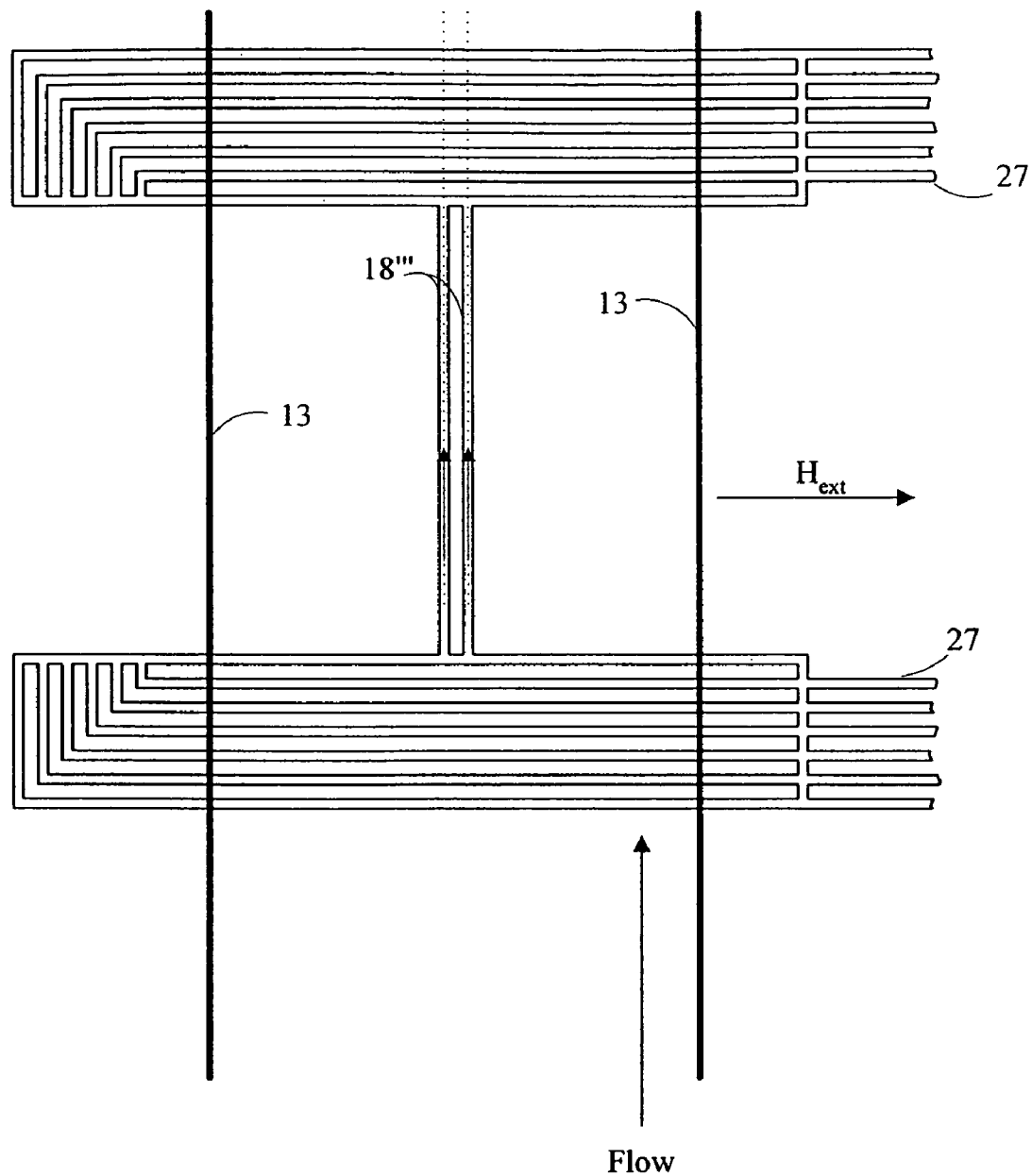
FIG. 19 shows a fragmentary top view representation of an enhancement to the present invention.

A director, 18''', for directing paired magnetic objects in the channel between side walls 13 is shown in the top view of FIG. 19 also using the same omission and transparency conditions used with FIG. 10. The arrangement is analogous to the single magnetic object director shown in FIG. 13, but here has a pair of director damascene Cu process conductors separated from one another across the channel width by an amount appropriate for the size of the paired objects considering their separation from one another. These two conductors extend along the extent of the channel in the flow direction to external interconnections 27 at each end thereof. The electrical current supplied from interconnections 27 splits in these two conductors into a current in each beginning at the upstream end of the device, indicated by the fine arrows shown in them, and is equal and parallel though the length of those conductors.

The pair of conductors is shown with a typical center-to-center separation of approximately 2.8 µm, which is ideal for guiding the motion of pairs of 2.8 µm diameter beads through this director location. Particle pairs, after being subjected to the guiding forces of the magnetic fields generated by the currents in these two conductors, travel out of the paired device director location along the fine dashed lines shown. The size and separation of the wires can be scaled to appropriately match the size of paired magnetic objects chosen to be directed by this device. The channel width is shown with a typical value of 50 µm. The length of the pair director wires is not shown to scale, and is again typically a few hundred microns to be whatever is required by flow velocities and magnetic object properties.

Figure 20:
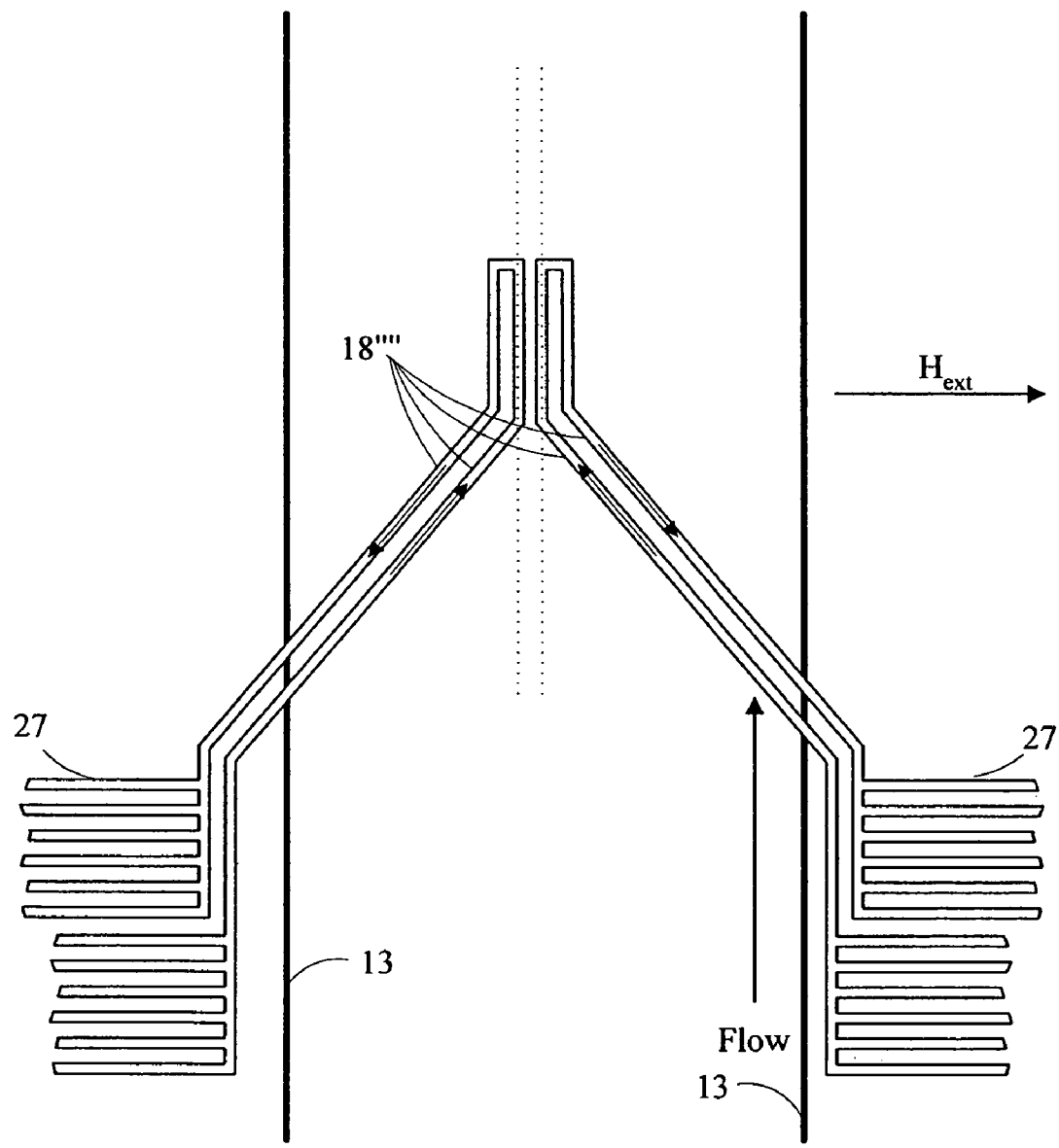
FIG. 20 shows a fragmentary top view representation of an enhancement to the present invention.

FIG. 20 shows in a top view a paired particle gathering device, 18"", that will often be chosen to be positioned immediately upstream of paired particle director 18''' shown in FIG. 19. FIG. 20 also uses the same omission and transparency conditions that are used with FIG. 10 and represents side walls 13 of the channel with solid lines. The gathering device is shown having two pairs of parallel damascene Cu process conductors extending from external interconnections conductors 27 to enter the channel from opposite sides thereof and extending toward one another over the length of the section of the channel in which this gathering device is shown to eventually come close to merging together at the opposite end. However, the member conductors of each pair do not remain separate but join together near the other pair at the center of the channel but with these two pairs remaining separate from one another.

Electrical currents, in use of the device, are established as indicated by the fine arrows in the conductors through the conductor pairs in director 18"" that are located immediately beneath the channel. These conductors are typically 1 µm wide, and the channel is typically about 50 µm wide. The length along the channel of this device, as with previous devices, is much greater relative to the channel width than represented in the diagram, and is typically about 400 µm for a 50 µm by 50 µm cross section for the channel.

As particle pairs flow downstream into the pair gatherer location, they are attracted towards the inner member of the two pairs of conductors but repelled by the outer members because of the currents in the outer members of the two pairs being in a direction opposite to the direction of current in the corresponding inner members thereof. This repulsion keeps the pair from traveling outside of the two pairs of conductors of the device. When the paired particles reach the downstream end of the gatherer 18"", they naturally are attracted by both of the inner members of the two pairs of conductors, and so line up with one particle over the inner member of one, and the other particle over the inner member of the other. Paired particles travel out of the pair director location along the fine dashed lines shown.

Figure 21:
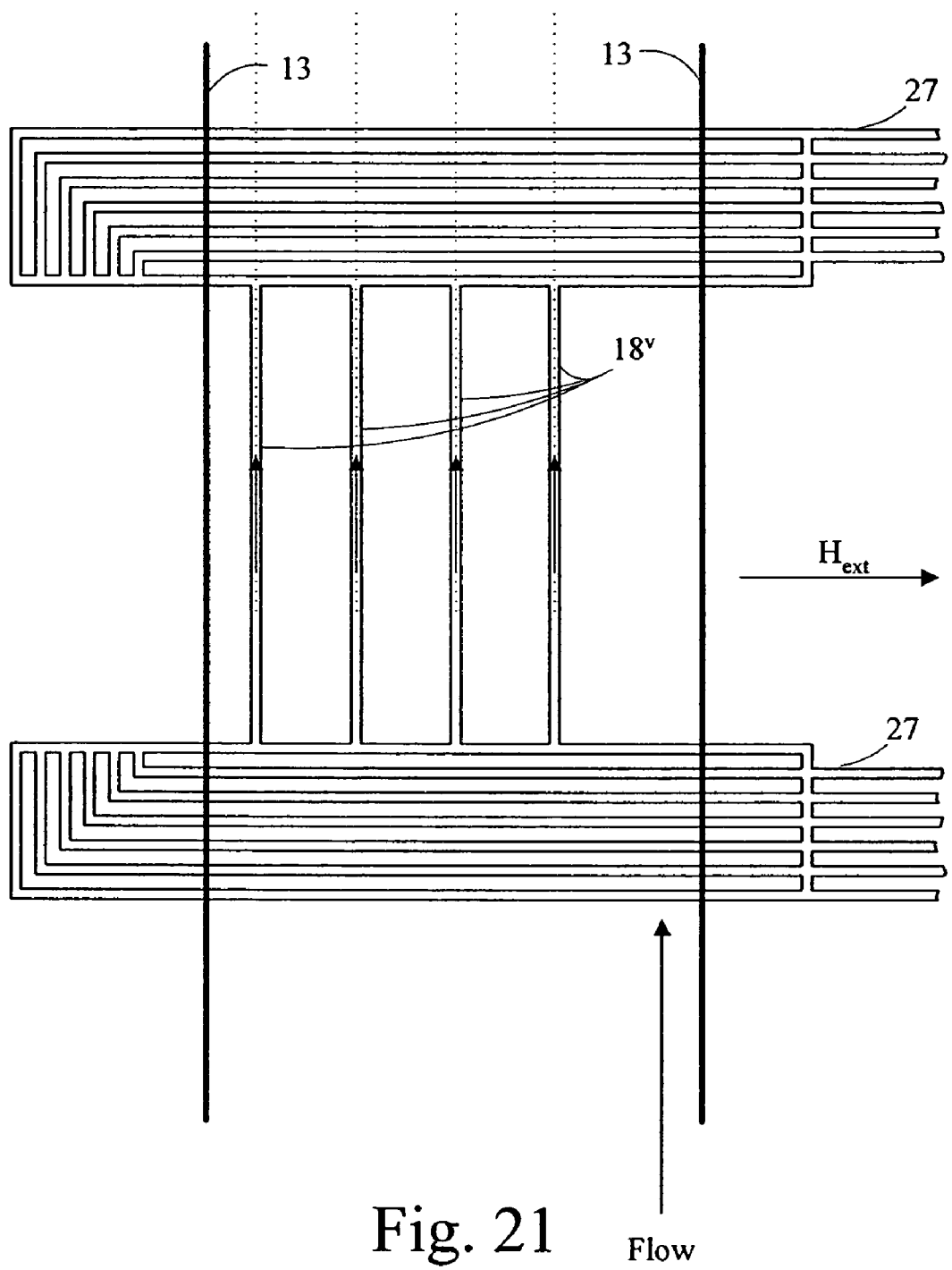
FIG. 21 shows a fragmentary top view representation of an enhancement to the present invention.

There can be advantages in some situations to attracting and directing magnetic objects along more than one or two sub-regions about a corresponding conductor in the cross section of a flow channel. FIG. 21 shows a top view of a quad director, 18$^v$, for directing magnetic objects in the flow channel between side walls 13 along one of four alternative damascene Cu process conductors separated from, but positioned parallel to, one another extending between external interconnections 27 at each end thereof. Here, too, FIG. 21 uses the same omission and transparency conditions that are used with FIG. 10 and represents side walls 13 of the channel with solid lines. These conductors are typically 1 µm wide, and the channel is again typically about 50 µm wide. The length along the channel of this device, as with previous devices, is much greater relative to the channel width than represented in the diagram, and may be several hundred microns long. Magnetic objects entering this location will leave following one of the four dashed lines. Often, this device will precede detector 22 of FIG. 10 along the flow channel with these dashed leaving path lines of the quad director being aligned with the four detector GMR magnetoresistors 22', 22", 22''' and 22$^{iv}$ shown in FIG. 10 which thus detects the magnetic objects following each of the four corresponding routes through the flow channel.

Figure 22:
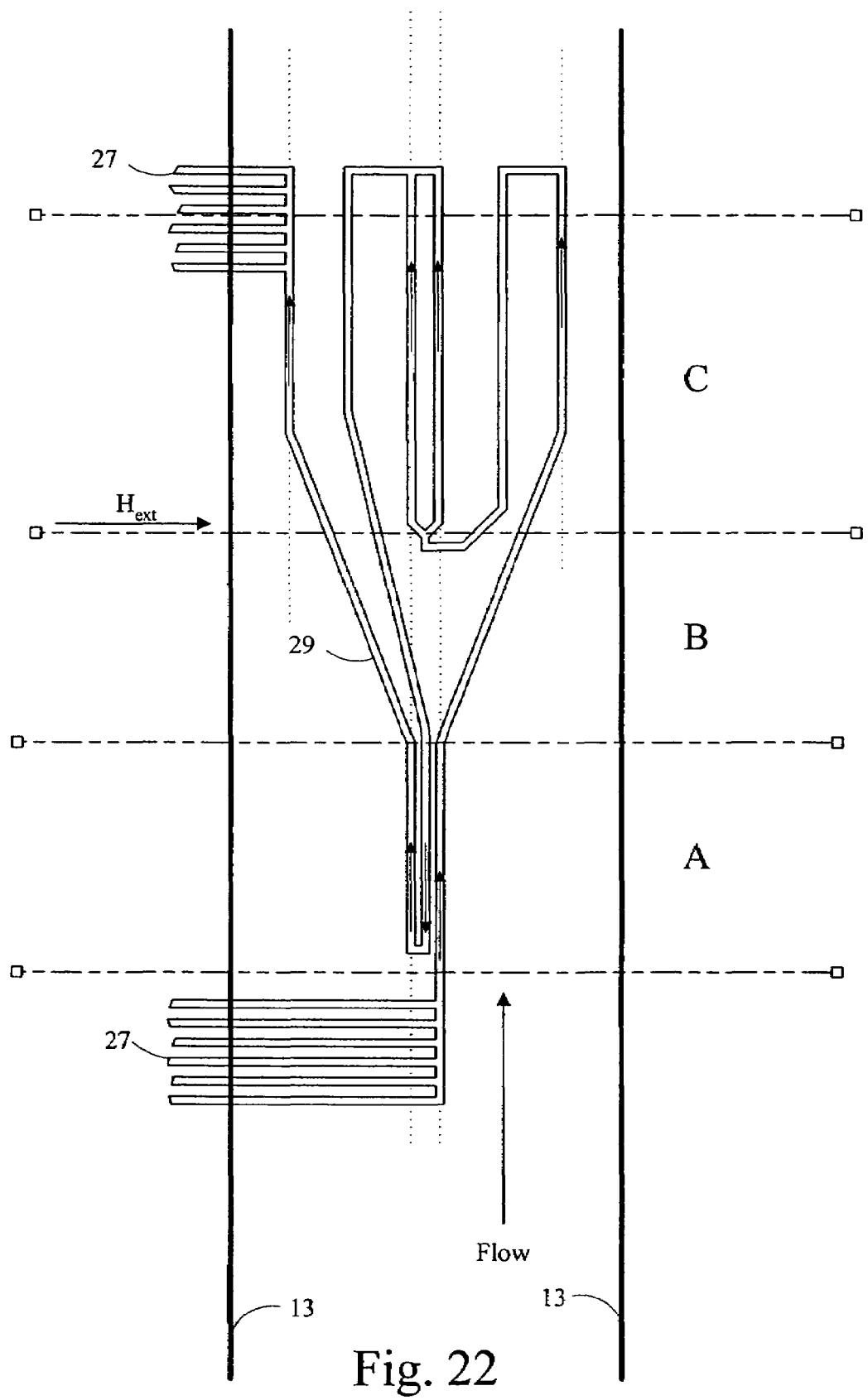
FIG. 22 shows a fragmentary top view representation of an enhancement to the present invention.

FIG. 22 shows a top view of an alternative to the sorting device shown in FIG. 17, again using the same omission and transparency conditions that are used with FIG. 10 and representing side walls 13 of the channel with solid lines. A damascene Cu process conductor with several branches is provided between external interconnections 27 to form this sorter, 29.

Paired particles enter first an upstream particle pair splitter device in the channel bottom regions along the two dashed lines shown. Section A has three parallel conductor branch portions to form this device with the outer two portions carrying electrical current in the fluid flow direction and the conductor branch portion between them carrying current in the reverse direction to thereby generate splitting forces on the pairs as described previously to result in splitting apart the more loosely bound pairs. Section B has three conductor branch portions that diverge away from one another to varying degrees along the fluid flow direction with the outer two portions carrying current in the fluid flow direction to attract single particles in the flow toward the sides of the channel, and the portion between them carrying current in the reverse direction which has an insignificant effect on still bound paired particles leaving such bound pairs moving along the bottom center.

These still bound pairs move to the centrally located parallel split conductors in section C which gathers these pairs to keep them moving along the channel center and bottom following the centered, nearby one another, dashed lines. The unbound individual particles move out of the device along the widely separated dashed line paths near the channel side walls, and along the channel bottom. Thus, GMR magnetoresistor detectors can be positioned downstream aligned with these dashed lines to detect both individual and paired particles. In some instances, the microfluidic channel may be split into two or more channels just downstream from such pair splitter and sorter location.

Figure 23:
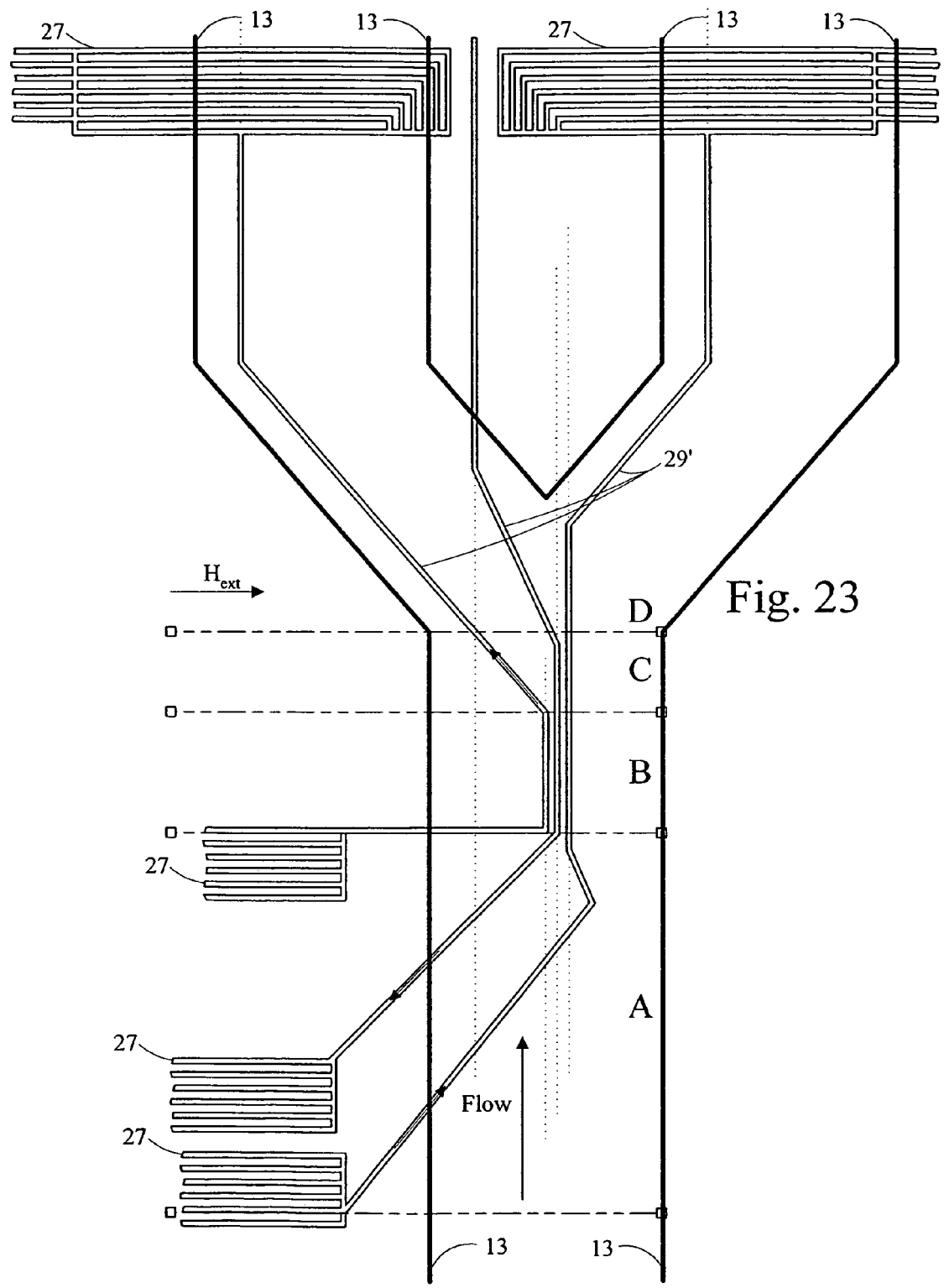
FIG. 23 shows a fragmentary top view representation of an enhancement to the present invention.
Figure 24:
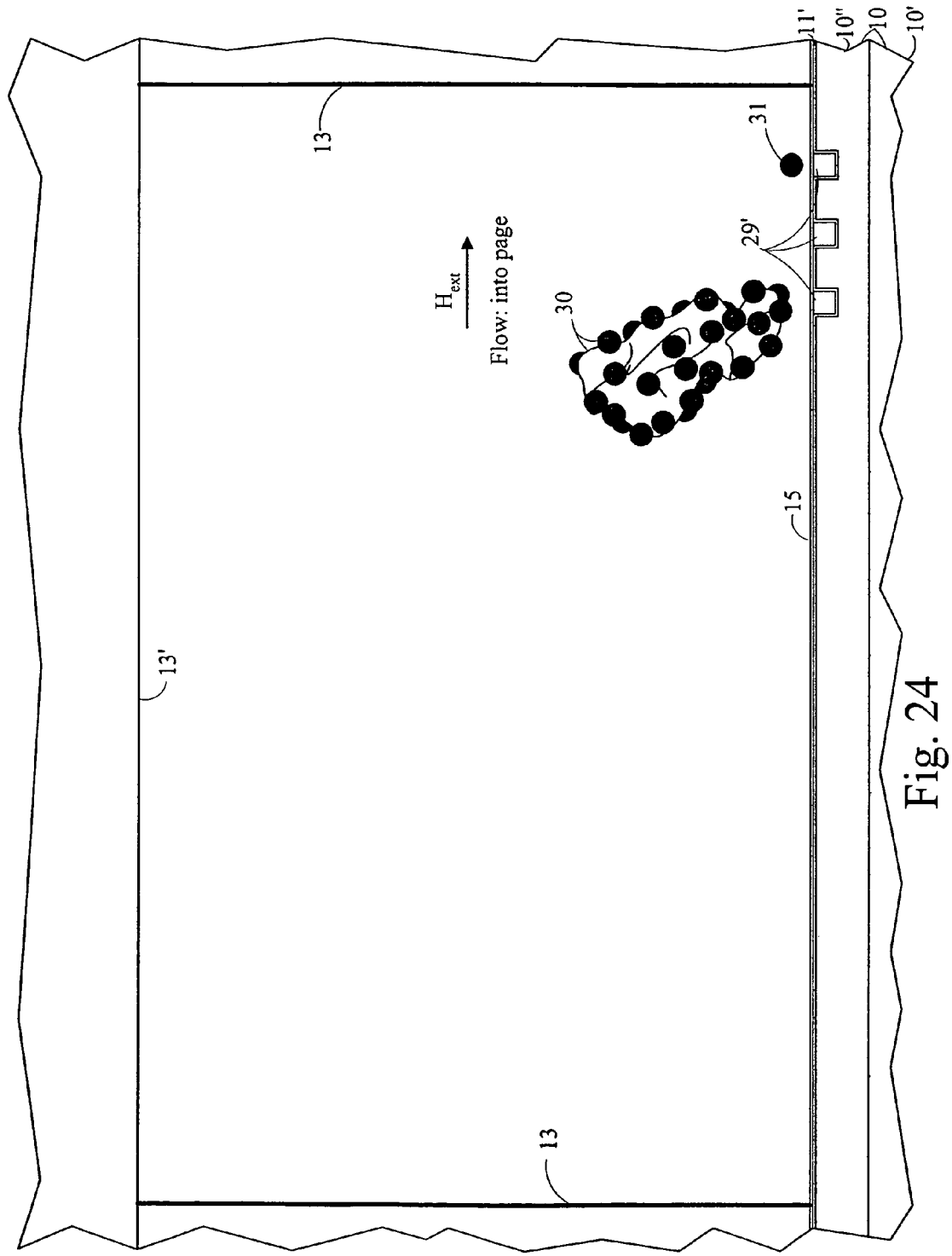
FIG. 24 shows a fragmentary cross section representation of the device structure of FIG. 23.

FIGS. 23 and 24 show a top view and cross section representation, respectively, of a size sorter device. FIG. 23 shows a top view of the size sorter, 29', for sorting magnetic objects in the flow channel between side walls 13 into one split section of the fluid flow channel or the other along one of the three alternative damascene Cu process conductors therein extending between external interconnections 27 at each end thereof (although not shown at one end of one of the conductors). Here, too, FIG. 23 uses the same omission and transparency conditions that are used with FIG. 10 and represents side walls 13 of the channel with solid lines.

The purpose of the sorter is to physically separate large and small magnetic material objects. An example, depicted in FIG. 24, is a biological cell, 30, with many approximately 1 µm diameter magnetic material particles as labels bound to it being separated from an unbound, similar sized magnetic material particle(s) as a label(s), 31. There are three steps performed in the indicated sections of FIG. 23: section A) magnetic objects are gathered to one central location at the end of the section in the channel by a director portion of the sorter having an attractor conductor on the right and a repulsive conductor on the left; section B) a second attractive conductor is positioned on the opposite side of repulsive conductor from the incoming attractive conductor. Large objects are attracted to second conductor, but small objects are unable to pass through the small repulsive region established by the now center conductor; section C) large and small objects are further separated from each other in the channel cross section by angling the two attractive directors apart from one another; section D) optionally, the flow channel can be split to permanently separate the flow of small and large objects. The attractive conductors continue to act in the downstream location of the device, causing large objects (e.g. biological cells) to depart along the upper left dashed line, and small objects (e.g. individual labels) to depart along the upper right dashed line.

The repulsive conductor repels because the electrical current therein is flowing opposite to that in the attractive conductors. This current direction is indicated by the thin arrows in the three conductors. Because the three directors in this location are connected to separate external current sources, they can carry completely different magnitudes of electrical current, which allows for fine-tuning the magnetic force being applied to the magnetic objects being sorted. It also allows for using time varying signals such as a very large but short in time current burst in the second attractive conductor. The balance that must be found for a given set of objects is to make the attraction of the large objects to the second attractive conductor much greater than to the first, while maintaining a sufficient repulsive barrier to small objects following the repulsive conductor. These conductors are typically 1 µm wide, and the channel is again typically about 50 µm wide. The length along the channel of this device, as with previous devices, is much greater relative to the channel width than represented in the diagram, and may be several hundred microns long.

Figure 25:
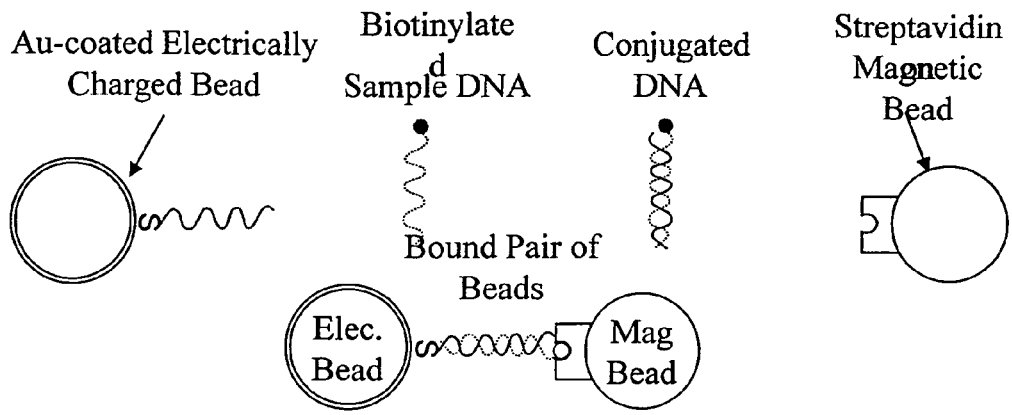
FIG. 25 shows a representation of alternate kinds of particles to be detected in a flow.

A further arrangement to create a force that tends to pull particle pairs apart is to use electrostatic forces in addition to magnetic forces. Particles with drastically different electrical polarization, or even excess electrical charge could be used. The sorting environment can be set up so that the force from electric fields and magnetic fields are opposite in direction and roughly equal in magnitude on the two particles. Then single electric and magnetic beads would be taken one way or the other, and paired ones would go straight (if using the 3-way sorter of FIG. 17). Having passed through this dual-force sorter, the bead pairs could be detected using a GMR detector and/or an electrostatic detector. A schematic of this type of bead pair is shown below in FIG. 25 with electrically charged and magnetically polarized beads attached through selective DNA binding. The electrically charged bead is shown as having a gold coating thereon to aid the thiol binding chemistry (as represented by the "S" on the bead). The electrically charged bead could be electrically polarized rather than charged.

Figure 26:
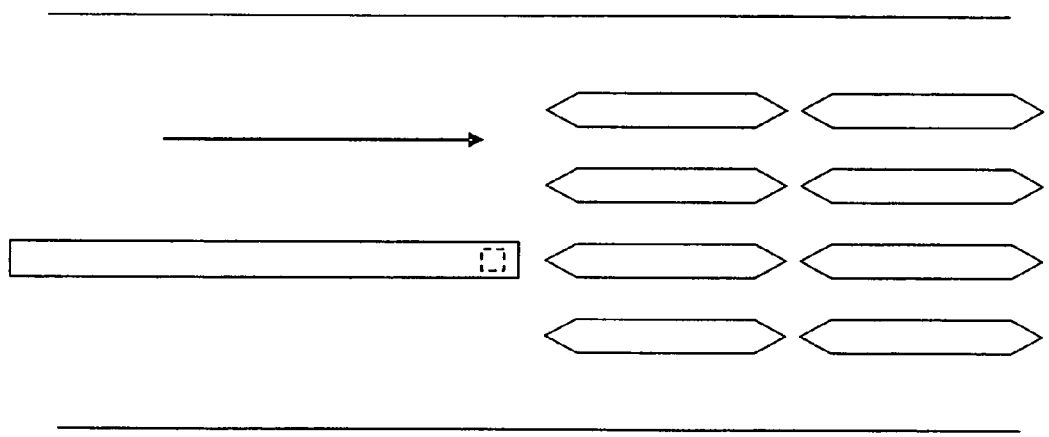
FIG. 26 shows a fragmentary top view of an alternate structure embodying the present invention for detecting the particles of FIG. 25 in a flow.

FIG. 26 shows a top view of a microfluidic flow channel with walls represented by the straight lines at the top and bottom. Beneath the channel is a director, shown here as a rectangle, the dotted square is a via down to conductors beneath to carry electrical current away. The eight pointy objects are GMR detectors. Each detector can be wired separately so that a distinct electrical signal is generated in each one. The arrow indicates the direction of flow in the channel. The two circles connected by a line represent particle pairs passing over the detector array.

The detector array is another way of distinguishing between single particles and pairs. It can also increase throughput, and allow for distinguishing one magnetic particle size or type from another.

Figure 27:
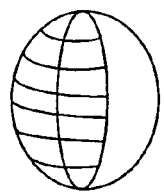
FIGS. 27, 28 and 29 show elements of another arrangement for detecting a further alternate kind of particles to be detected in a flow.
Figure 27:
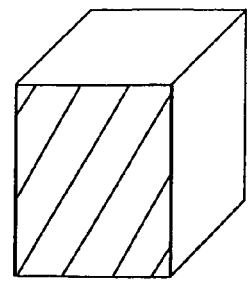

FIG. 27 shows particles with biochemical functional capability on only a portion (the hashed area) of the outside surface.

A non-ellipsoidal particle (say it is a rectangular solid with dimensions 1 micron×1 micron×500 nm for the sake of this discussion) can be made with a permanent (high coercivity) magnetic layer just beneath the surface. In the absence of an externally applied magnetic field, this permanent magnet generates stray fields will attract linearly magnetizable particles.

Figure 28:
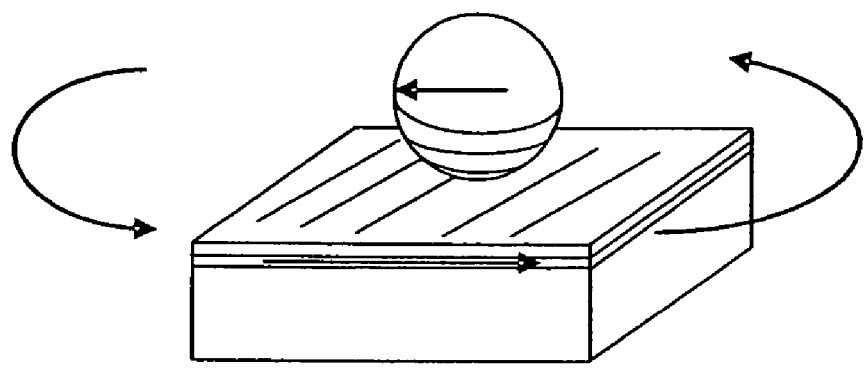

FIG. 28 shows the bottom piece is a biofunctional capability solid with a high coercivity magnetic layer. The curved arrows indicate the stray fields generated by this layer that affect a nearby biofunctional capability label particle.

Figure 29:
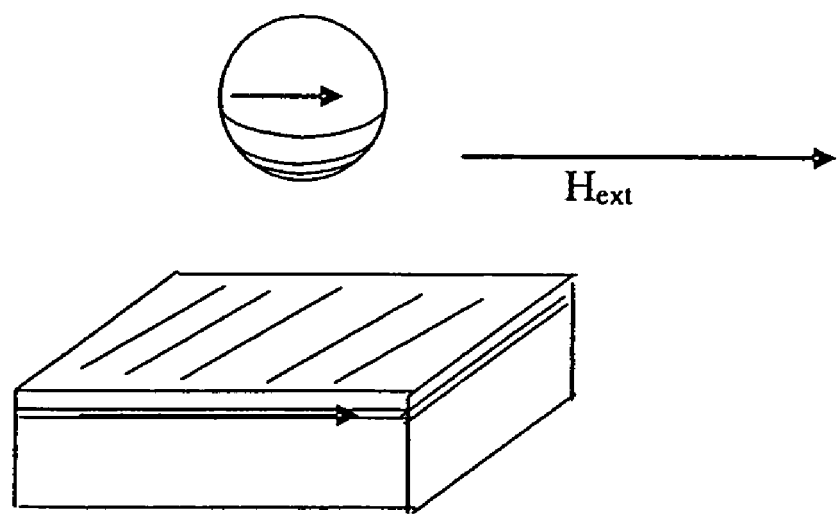

FIG. 29 shows the particle and block are repelled in a large external field.

If a large external field is applied (larger than the magnitude of the stray field at the block's surface) the block will rotate in the fluid so that its magnetization is parallel to the external field. This assumes that the moment of the block is larger than the soft magnetic particle. Then, the magnetization of the magnetically soft particle will rotate to be parallel to the large applied field. This generates a repulsive magnetostatic interaction between the block and sphere. This can be used to cause non-specifically bound particles to separate.

In practice, there are several forces and energy scales involved. At length scales below 100 nm, the thermal energy of the fluid (Brownian motion) will be competitive with the magnetostatic attractive energies. Also, there are other fluidic forces in the flowstream that might act to pull particles apart (e.g. non-uniform flow velocities and differential viscous drag).

Although the present invention has been described with reference to preferred embodiments, workers skilled in the art will recognize that changes may be made in form and detail without departing from the spirit and scope of the invention.

The invention claimed is:

1. A method for detecting magnetic particles entrained in a fluid provided in a channel gap formed in a channel base material supported on at least a portion of a substrate at a sensor location where a magnetic field sensor is also supported on at least a portion of said substrate but without said channel base material being across said magnetic field sensor from said substrate so as to form sides of an extended opening therein at said sensor location that extends past said magnetic field sensor in at least one direction to thereby form an extended said channel gap in said channel base material across from at least a portion of said sensor location, there being a first electrical conductor supported on said substrate positioned at least in part at said sensor location so as to be in direct contact with at least some surface of said magnetic field sensor and a second electrical conductor supported on said substrate positioned at least in part along, and between projections of said sides of, said channel gap in a region thereof adjacent to, but separated from, said magnetic field sensor, said method comprising:

introducing said fluid with said magnetic particles entrained therein into said channel gap so as to be present at said sensor location;

supplying a selected first electrical current in said first electrical conductor and said magnetic field sensor while monitoring that voltage occurring across said magnetic field sensor;

supplying a selected second electrical current in said second electrical conductor; and supplying a magnetic field from a source other than said magnetic particles in a selected direction such that said magnetic field is present in said channel gap.

2. The method of claim 1 wherein said selected direction of said magnetic field is from one said side of said extending opening forming said channel gap at least at said sensor location to an opposite said side thereof to thereby extend through said channel gap substantially perpendicular to said sides there.

3. The method of claim 1 wherein said selected direction of said magnetic field is from one said side of said magnetic field sensor to an opposite said side thereof to thereby extend through said channel gap substantially parallel to said sides there.

* * * * *